United States Patent
Ross et al.

(10) Patent No.: US 9,928,194 B2
(45) Date of Patent: Mar. 27, 2018

(54) NON-LINEAR TRANSMIT BIASING FOR A SERIAL BUS TRANSMITTER

(71) Applicant: Allegro Microsystems, LLC, Worcester, MA (US)

(72) Inventors: Thomas Ross, Howden (GB); Aldo Togneri, Roslin (GB); James McIntosh, Longniddry (GB); Gianluca Allegrini, Musselburgh (GB)

(73) Assignee: Allegro Microsystems, LLC, Worcester, MA (US)

(*) Notice: Subject to any disclaimer, the term of this patent is extended or adjusted under 35 U.S.C. 154(b) by 256 days.

(21) Appl. No.: 14/954,133

(22) Filed: Nov. 30, 2015

(65) Prior Publication Data
US 2017/0153996 A1    Jun. 1, 2017

(51) Int. Cl.
*G06F 13/42*    (2006.01)
*G06F 13/364*   (2006.01)
(Continued)

(52) U.S. Cl.
CPC .......... *G06F 13/364* (2013.01); *G06F 13/404* (2013.01); *G06F 13/4282* (2013.01);
(Continued)

(58) Field of Classification Search
CPC .... G06F 13/4282; G06F 13/364; G06F 13/40; G06F 13/42; G06F 13/404
(Continued)

(56) References Cited

U.S. PATENT DOCUMENTS

| 5,859,552 A | 1/1999 | Do et al. |
| 5,949,254 A | 9/1999 | Keeth |

(Continued)

FOREIGN PATENT DOCUMENTS

| DE | 692 31 612 T2 | 5/2001 |
| DE | 10 2014 010 202 | 5/2015 |
| EP | 2 846 487 | 12/2014 |

OTHER PUBLICATIONS

Notice of Allowance dated Dec. 16, 2016 regarding U.S. Appl. No. 14/996,689; 13 pages.
(Continued)

*Primary Examiner* — Kevin M Burd
(74) *Attorney, Agent, or Firm* — Daly, Crowley, Mofford & Durkee, LLP

(57) ABSTRACT

Described embodiments provide a transmitter for transmitting data over a serial bus coupled to the transmitter. The transmitter includes a controller to generate data for transmission by the transmitter. A transmit driver is coupled to the controller. The transmit driver, in response to the generated data for transmission, generates logic transitions on the serial bus. The transmit driver generates low-to-high logic transitions on the serial bus by charging the serial bus by a bus current based on (i) a predetermined initial bias level for a first time period, and (ii) a first predetermined maximum bias level for a second time period. The transmit driver generates high-to-low logic transitions on the serial bus by discharging the serial bus by a bus current based on (i) a pre-charged level of the transmit driver, and (ii) a second predetermined maximum bias level for a third time period.

30 Claims, 10 Drawing Sheets

(51) Int. Cl.
*G06F 13/40* (2006.01)
*H03K 5/08* (2006.01)
*H03K 19/0185* (2006.01)
*H04L 12/40* (2006.01)

(52) U.S. Cl.
CPC ....... *H03K 5/08* (2013.01); *H03K 19/018521* (2013.01); *H04L 12/40032* (2013.01); *H04L 2012/40234* (2013.01)

(58) Field of Classification Search
USPC ........................................................ 375/257
See application file for complete search history.

(56) References Cited

U.S. PATENT DOCUMENTS

| | | | |
|---|---|---|---|
| 6,118,310 | A | 9/2000 | Esch, Jr. |
| 6,300,806 | B1 | 10/2001 | Theus et al. |
| 6,380,728 | B1 | 4/2002 | Tareilus et al. |
| 6,509,757 | B1 | 1/2003 | Humphrey |
| 7,148,725 | B1 * | 12/2006 | Chan .................. H03K 5/08 326/26 |
| 8,035,418 | B2 | 10/2011 | Oh et al. |
| 8,957,715 | B2 | 2/2015 | Eagen |
| 2002/0093366 | A1 | 7/2002 | Fotouhi |
| 2008/0272813 | A1 | 11/2008 | Bouillet |
| 2011/0291707 | A1 * | 12/2011 | Illegems .......... H03K 17/08104 327/108 |

OTHER PUBLICATIONS

Search Report and Written Opinion dated Jan. 19, 2017 for PCT Application No. PCT/US2016/061261; 14 pages.
U.S. Appl. No. 14/996,689, filed Jan. 15, 2016, Fernandez.
U.S. Appl. No. 14/996,689, filed Jan. 15, 2015, Fernandez et al.
Restriction Requirement dated Dec. 11, 2013; for U.S. Appl. No. 13/653,624; 6 pages.
Response dated Dec. 31, 2013 to Restriction Requirement dated Dec. 11, 2013; for U.S. Appl. No. 13/653,824; 12 pages.
Office Action dated Mar. 7, 2014; for U.S. Appl. No. 13/653,824; 22 pages.
Response dated May 30, 2014 to Office Action dated Mar. 7, 2014; for U.S. Appl. No. 13/653,824; 19 pages.
Final Office Action dated Jun. 16, 2014; for U.S. Appl. No. 13/653,824; 27 pages.
Request for Continued Examination dated Oct. 10, 2014; for U.S. Appl. No. 13/653,824; 3 pages.
Response dated Oct. 10, 2014 to Final Office Action dated Jun. 16, 2014; for U.S. Appl. No. 13/653,824; 18 pages.
Notice of Allowance dated Oct. 29, 2014; for U.S. Appl. No. 13/653,824, 10 pages.
German Office Action (with English translation) dated Sep. 1, 2015; for German Pat. App. No. 102013111113.0; 12 pages.
"LIN Specification Package" by LIN Consortium, Revision 2.2A dated Dec. 31, 2010; 194 pages.
Reporting Letter and Response to German Office Action dated Sep. 1, 2015 corresponding to German Patent Application No. 102013111113.0; Response filed on Mar. 4, 2016; 34 Pages.

* cited by examiner

100

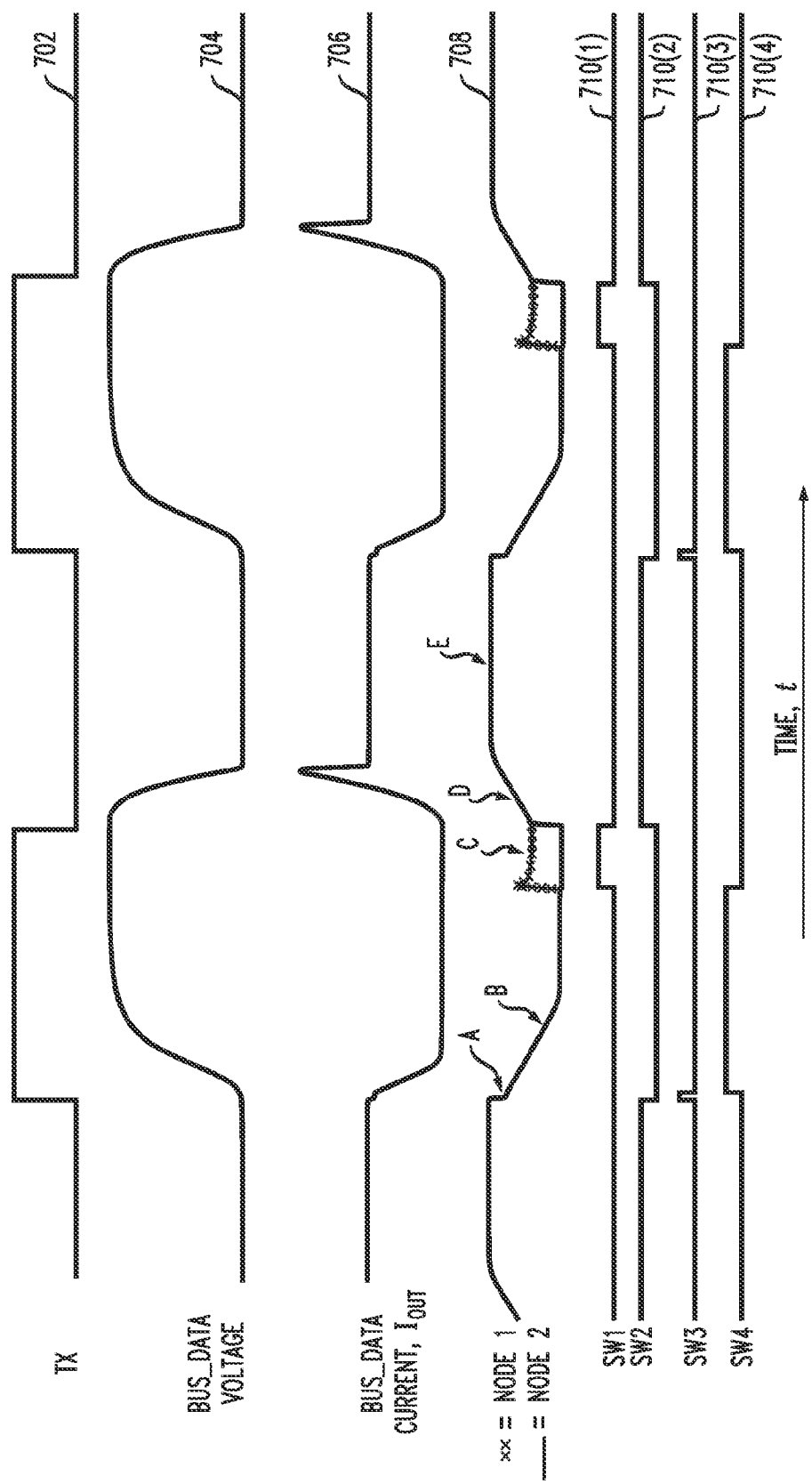

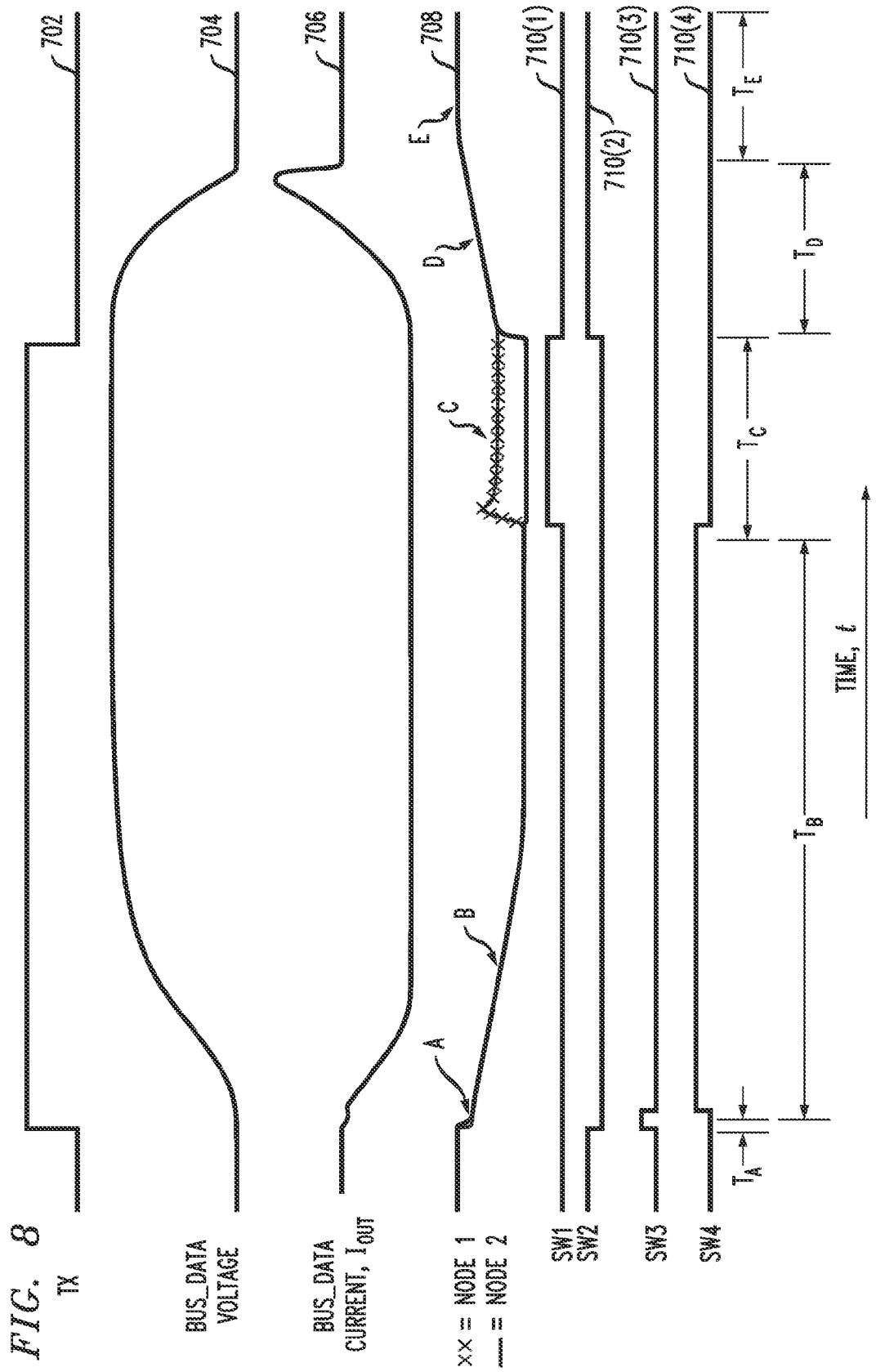

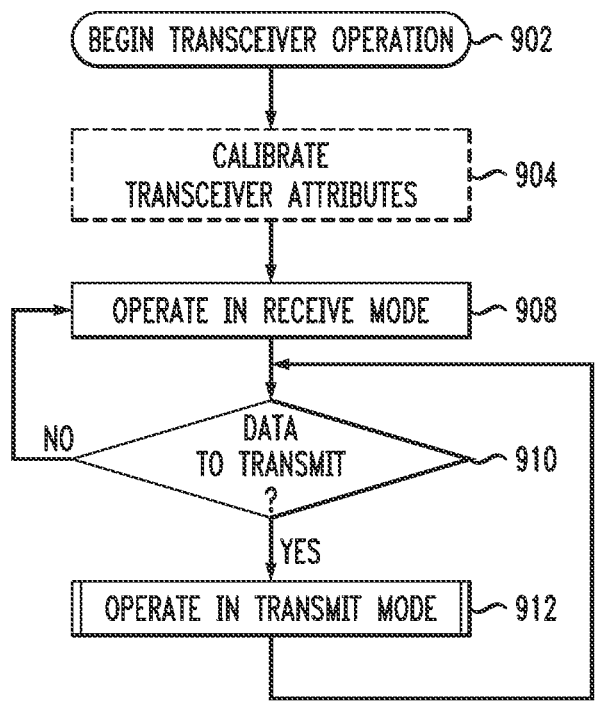

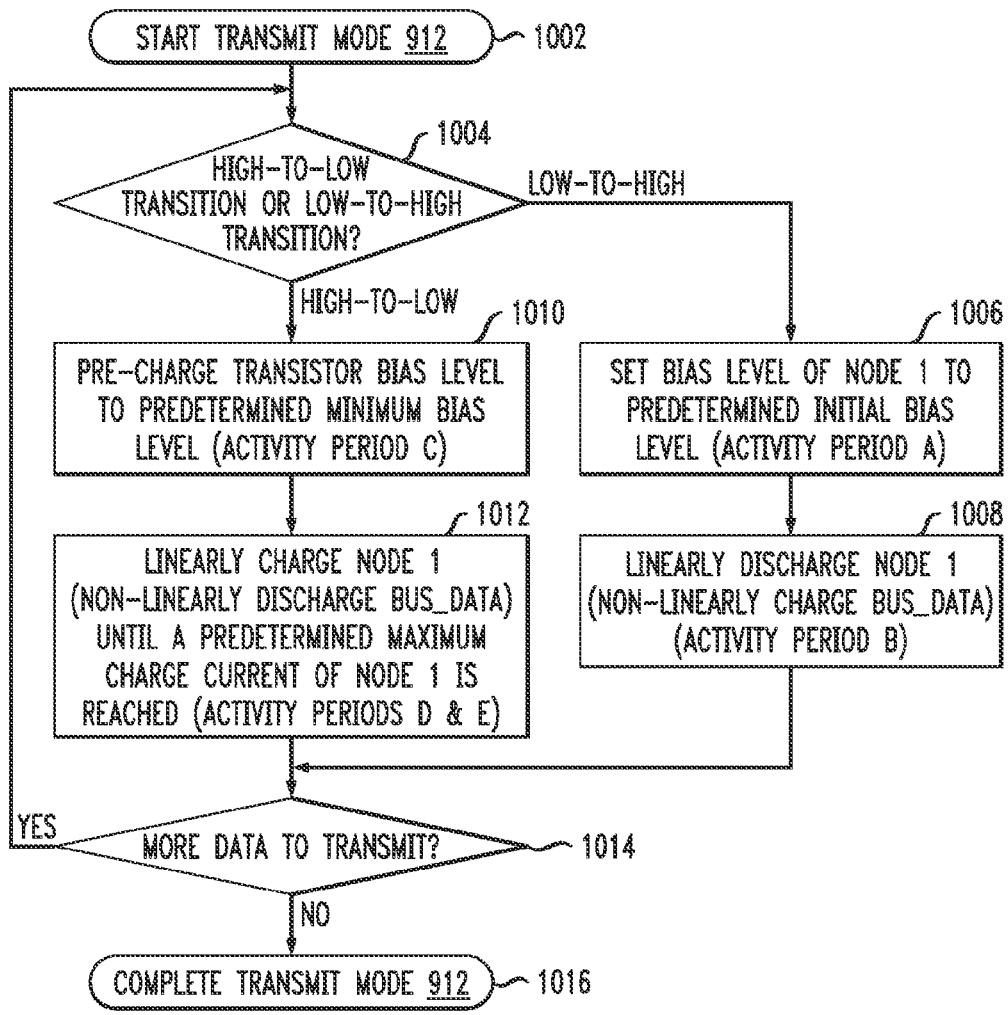

NON-LINEAR TRANSMIT BIASING FOR A SERIAL BUS TRANSMITTER

CROSS-REFERENCE TO RELATED APPLICATIONS

None.

STATEMENT REGARDING FEDERALLY SPONSORED RESEARCH OR DEVELOPMENT

None.

BACKGROUND

In vehicle systems, numerous sensors are employed to monitor operating parameters such as current, speed, angle, linear position, rotational direction, temperature, etc. of an article associated with a control module, such as a power steering module, a fuel injection module, an anti-lock brake module, etc. The sensor output signals are provided over a communication bus to a system controller, such as an Electronic/Engine Control Unit (ECU) or Engine Control Module (ECM), which processes data provided by the various sensors. Vehicle systems commonly employ communication buses that are coupled to multiple sensors (and/or other devices) to communicate commands and data (e.g., a shared bus network).

Commonly, vehicle system components that are considered safety critical, such as the various ECUs and ECM, might employ relatively faster, more complex and more expensive buses, such as CAN (Controller Area Network) or FlexRay™ buses. For example, the ECM might employ a CAN bus to communicate with sensors in critical systems such as the transmission system, braking system, airbag control system, traction/stability control system, and other similar systems. Higher bandwidth automotive components, such as multimedia, entertainment and location-based systems might employ Bluetooth® (IEEE 802.15), MOST (Media Oriented Systems Transport), FireWire (IEEE 1394) or other similar communication links that are also relatively fast, complex, and expensive.

The LIN (Local Interconnect Network) protocol is a single wire bidirectional serial communication protocol commonly used to communicate between relatively lower bandwidth and relatively less safety critical devices in the vehicle system. A communication bus operating in accordance with the LIN protocol links a master device (e.g., the ECM) and up to 16 slave devices. The LIN protocol can be implemented having a relatively simple and cost effective transceiver circuit due to its lower bandwidth and single wire serial communication. Therefore, less data intensive and less safety critical automotive subsystems might beneficially employ a LIN bus to reduce complexity and cost, for example, seat controls, window controls, climate controls, windshield wiper controls, lighting controls and other similar systems.

The communication protocol, features, and hardware and software requirements of the LIN protocol are set forth in the LIN Specification Package (hereinafter "LIN specification"), published by the LIN Consortium, Revision 2.2A, on Dec. 31, 2010, which is hereby incorporated by reference herein in its entirety. As described in the LIN specification, the bus derives its power from the automobile battery voltage ($V_{batt}$) and ground (or circuit common) of the automobile electrical system. The LIN specification also sets forth a minimum threshold voltage for a receiver to detect a logic high signal ($TH_{Rec}$), a maximum threshold for a receiver to detect a logic low signal ($TH_{Dom}$), duty cycles for transmitted bits, and rise and fall times for logic transitions.

However, shifts in supply voltage (for example based on the charge state and operating condition of the vehicle battery), resistance and parasitic components (i.e., inductance and capacitance) of bus cables, and electromagnetic interference (EMI) present on the bus can make it difficult for LIN transmitters to meet the LIN protocol requirements. For example, a long bus cable might have relatively high resistance and parasitic components, and be exposed to relatively high amounts of EMI. Thus, a LIN transmitter coupled to a long bus cable might have difficulty meeting the timing requirements for logic state transitions to charge or discharge the bus for a logic high or logic low, respectively, to be detected by a LIN receiver. Similarly, a short bus cable might have relatively low resistance and parasitic components, and be exposed to less EMI. Thus, a LIN transmitter coupled to a short cable might operate inefficiently from a power perspective since the transmitter might be driving the bus at a higher current draw than necessary (e.g., greater power consumption). Further, by having very quick logic state transitions, a LIN transmitter might generate additional EMI for other components coupled to, or located in proximity to, the bus. Therefore, an improved transmit driver is envisioned for LIN devices to communicate more reliably and with higher power efficiency.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

One aspect provides a transmitter for transmitting data over a serial bus coupled to the transmitter. The transmitter includes a controller to generate data for transmission by the transmitter. A transmit driver is coupled to the controller. The transmit driver, in response to the generated data for transmission, generates logic transitions on the serial bus. The transmit driver generates low-to-high logic transitions on the serial bus by charging the serial bus by a bus current based on (i) a predetermined initial bias level for a first time period, and (ii) a first predetermined maximum bias level for a second time period. The transmit driver generates high-to-low logic transitions on the serial bus by discharging the serial bus by a bus current based on (i) a pre-charged level of the transmit driver, and (ii) a second predetermined maximum bias level for a third time period.

In an embodiment, the transmit driver includes an output transistor having an output node coupled to the serial bus. The output transistor generates low-to-high logic transitions on the serial bus when the controller (i) sets a bias level of the output transistor to a predetermined initial bias level by a first bias current, and (ii) linearly changes the bias level from the predetermined initial bias level to a second bias level by a predetermined second bias current. The output node is non-linearly charged. The output transistor generates high-to-low logic transitions on the serial bus when the controller (i) pre-charges the bias level of the output transistor to a pre-charge bias level by a pre-charge bias current, and (ii) linearly changes the bias level from the pre-charge bias level to a fourth bias level. The output transistor non-linearly discharges the output node.

In an embodiment, the output transistor is a metal-oxide semiconductor field effect transistor (MOSFET).

In an embodiment, the output transistor is an N-channel MOSFET. The N-channel MOSFET generates low-to-high logic transitions on the serial bus when the controller (i) sets the bias level of a gate of the output transistor to the predetermined initial bias level, and (ii) linearly discharges the gate from the predetermined initial bias level to the second bias level. The second bias level is a minimum bias threshold of the MOSFET. The N-channel MOSFET generates high-to-low logic transitions on the serial bus when the controller (i) pre-charges the gate of the output transistor to the pre-charge bias level by a pre-charge bias current, and (ii) linearly charges the gate from the pre-charge bias level to the fourth bias level. The fourth bias level is a maximum bias threshold of the MOSFET. The output node is non-linearly charged and discharged by changing a drain-to-source current through the MOSFET according to a squared value of the bias level.

In an embodiment, the output transistor is a P-channel MOSFET. The P-channel MOSFET generates low-to-high logic transitions on the serial bus when the controller (i) pre-charges a gate of the output transistor to a pre-charge bias level by a pre-charge bias current, and (ii) linearly charges the gate from the pre-charge bias level to a maximum bias threshold of the MOSFET. The P-channel MOSFET generates high-to-low logic transitions on the serial bus when the controller (i) sets the gate of the output transistor to a predetermined initial bias level, and (ii) linearly discharges the gate from the predetermined initial bias level to a minimum bias threshold of the MOSFET. The output node is non-linearly charged and discharged by changing a drain-to-source current through the MOSFET according to a squared value of the bias level.

In an embodiment, the output transistor is a bipolar junction transistor (BJT).

In an embodiment, the output transistor is an NPN doped BJT. The NPN BJT generates low-to-high logic transitions on the serial bus when the controller (i) sets a bias level of a base of the output transistor to a predetermined initial bias level, and (ii) linearly discharges the base from the predetermined initial bias level to the second bias level. The second bias level is a minimum bias threshold of the BJT. The NPN BJT generates high-to-low logic transitions on the serial bus when the controller (i) pre-charges the base to the pre-charge bias level, and (ii) linearly charges the base from the pre-charge bias level to the fourth bias level. The fourth bias level is a maximum bias threshold of the BJT. The output node is non-linearly charged and discharged by changing a collector-to-emitter current through the NPN BJT proportionally to an exponential of the bias level.

In an embodiment, the output transistor is a PNP doped BJT. The PNP BJT generates low-to-high logic transitions on the serial bus when the controller (i) pre-charges a base of the output transistor to a pre-charge bias level by a pre-charge bias current, and (ii) linearly charges the base from the pre-charge bias level to a maximum bias threshold of the BJT. The PNP BJT generates high-to-low logic transitions on the serial bus when the controller (i) sets the base of the output transistor to a predetermined initial bias level, and (ii) linearly discharges the base from the predetermined initial bias level to a minimum bias threshold of the BJT. The output node is non-linearly charged and discharged by changing a collector-to-emitter current through the PNP BJT proportionally to an exponential of the bias level.

In an embodiment, the controller linearly changes the bias level from the predetermined initial bias level to the second bias level in a first predetermined time duration. In an embodiment, the controller linearly changes the bias level from the pre-charge bias level to the fourth bias level in a second predetermined time duration.

In an embodiment, the controller calibrates the transmitter. In an embodiment, the controller calibrates the transmitter by estimating one or more parasitic components of the serial bus. The controller sets at least one of the predetermined initial bias level, the second bias level, the pre-charge bias level, the maximum bias level, the minimum bias level, the first predetermined time duration, and the second predetermined time duration based, at least in part, on the estimated one or more parasitic components of the serial bus.

In an embodiment, the transmit driver includes an amplifier to (i) buffer a control signal from the processor to the output transistor and (ii) generate an amplified bias signal to the output transistor.

In an embodiment, the transmit driver includes at least one current mirror circuit to drive the output transistor based on at least one of the control signal and the amplified bias signal.

In an embodiment, the transmitter is configured to operate open loop.

In an embodiment, the serial bus is a Local Interconnect Network (LIN) bus.

Another aspect provides a plurality of devices coupled to a serial bus. Each of the plurality of devices includes a controller to generate data for transmission by a transmitter of the device over the serial bus. The transmitter includes a transmit driver coupled to the controller. In response to the generated data for transmission, the transmit driver generates logic transitions on the serial bus. The transmit driver generates low-to-high logic transitions on the serial bus by charging the serial bus by a bus current based on (i) a predetermined initial bias level for a first time period, and (ii) a first predetermined maximum bias level for a second time period. The transmit driver generates high-to-low logic transitions on the serial bus by discharging the serial bus by a bus current based on (i) a pre-charged level of the transmit driver, and (ii) a second predetermined maximum bias level for a third time period.

In an embodiment, the transmit driver includes an output transistor having an output node coupled to the serial bus. The output transistor generates low-to-high logic transitions on the serial bus when the controller (i) sets a bias level of the output transistor to a predetermined initial bias level by a first bias current, and (ii) linearly changes the bias level from the predetermined initial bias level to a second bias level by a predetermined second bias current. The output node is non-linearly charged. The output transistor generates high-to-low logic transitions on the serial bus when the controller (i) pre-charges the bias level of the output transistor to a pre-charge bias level by a pre-charge bias current, and (ii) linearly changes the bias level from the pre-charge bias level to a fourth bias level. The output transistor non-linearly discharges the output node.

In an embodiment, the output transistor is either a metal-oxide semiconductor field effect transistor (MOSFET) or a bipolar junction transistor (BJT).

In an embodiment, the plurality of devices are at least one of: a motor control, a magnetic field sensor, a gear shift sensor, a speed sensor, a current sensor, a temperature sensor, an automotive lighting control, an automotive seat position control, a transmission sensor, a wheel speed sensor, a crankshaft sensor, and a camshaft sensor.

In an embodiment, the controller calibrates the transmitter. In an embodiment, the controller calibrates the transmitter by estimating one or more parasitic components of the serial bus. The controller sets at least one of the predetermined initial bias level, the second bias level, the pre-charge bias level, the maximum bias level, the minimum bias level, the first predetermined time duration, and the second predetermined time duration based, at least in part, on the estimated one or more parasitic components of the serial bus.

In an embodiment, the transmit driver includes an amplifier to (i) buffer a control signal from the processor to the output transistor and (ii) generate an amplified bias signal to the output transistor.

In an embodiment, the transmit driver includes at least one current mirror circuit to drive the output transistor based on at least one of the control signal and the amplified bias signal.

In an embodiment, the transmitter is configured to operate open loop.

In an embodiment, the serial bus is a Local Interconnect Network (LIN) bus.

Yet another aspect provides a method of operating a transmitter coupled to a serial bus. The method includes determining, by a controller of the transmitter, whether one or more data bits are to be transmitted over the serial bus. For each data bit to be transmitted, a transmit driver of the transmitter generates logic transitions on the serial bus. The transmit driver generates a low-to-high logic transition on the serial bus by charging the serial bus by a bus current based on (i) a predetermined initial bias level for a first time period, and (ii) a first predetermined maximum bias level for a second time period. The transmit driver generates a high-to-low logic transition on the serial bus by discharging the serial bus by a bus current based on (i) a pre-charged level of the transmit driver, and (ii) a second predetermined maximum bias level for a third time period.

In an embodiment, the transmit driver includes an output transistor having an output node coupled to the serial bus. The output transistor generates low-to-high logic transitions on the serial bus when the controller (i) sets a bias level of the output transistor to a predetermined initial bias level by a first bias current, and (ii) linearly changes the bias level from the predetermined initial bias level to a second bias level by a predetermined second bias current. The output node is non-linearly charged. The output transistor generates high-to-low logic transitions on the serial bus when the controller (i) pre-charges the bias level of the output transistor to a pre-charge bias level by a pre-charge bias current, and (ii) linearly changes the bias level from the pre-charge bias level to a fourth bias level. The output transistor non-linearly discharges the output node.

In an embodiment, the output transistor is either a metal-oxide semiconductor field effect transistor (MOSFET) or a bipolar junction transistor (BJT).

In an embodiment, the controller calibrates the transmitter. In an embodiment, the controller calibrates the transmitter by estimating one or more parasitic components of the serial bus. The controller sets at least one of the predetermined initial bias level, the second bias level, the pre-charge bias level, the maximum bias level, the minimum bias level, the first predetermined time duration, and the second predetermined time duration based, at least in part, on the estimated one or more parasitic components of the serial bus.

In an embodiment, the transmit driver includes an amplifier to (i) buffer a control signal from the processor to the output transistor and (ii) generate an amplified bias signal to the output transistor.

In an embodiment, the transmit driver includes at least one current mirror circuit to drive the output transistor based on at least one of the control signal and the amplified bias signal.

In an embodiment, the transmitter is configured to operate open loop.

In an embodiment, the serial bus is a Local Interconnect Network (LIN) bus.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure might be repeated in one or more subsequent figures without additional description in the specification in order to provide context for other features.

FIG. 7 shows an illustrative timing diagram of the transmitter of FIG. 5;

FIG. 8 shows a magnified view of a portion of the timing diagram of FIG. 7;

FIG. 9 shows a flow diagram of a process for operating the transceiver of FIG. 3; and FIG. 10 shows a flow diagram of a process for operating the transmitter of FIG. 5.

DETAILED DESCRIPTION

In accordance with described embodiments, described embodiments provide a transmitter for transmitting data over a serial bus coupled to the transmitter. The transmitter includes a controller to generate data for transmission by the transmitter. A transmit driver is coupled to the controller. The transmit driver, in response to the generated data for transmission, generates logic transitions on the serial bus. The transmit driver generates low-to-high logic transitions on the serial bus by charging the serial bus by a bus current based on (i) a predetermined initial bias level for a first time period, and (ii) a first predetermined maximum bias level for a second time period. The transmit driver generates high-to-low logic transitions on the serial bus by discharging the serial bus by a bus current based on (i) a pre-charged level of the transmit driver, and (ii) a second predetermined maximum bias level for a third time period.

Figure 1:
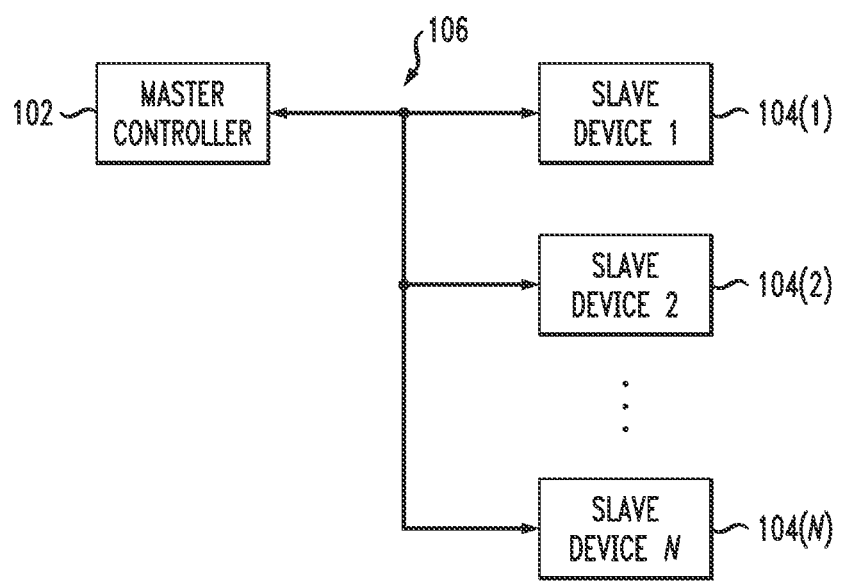
FIG. 1 shows a block diagram of a system having a plurality of devices coupled to a bidirectional communication bus, in accordance with illustrative embodiments.

FIG. 1 shows a block diagram of system 100 having controller 102 coupled to a plurality of devices, shown as devices 104(1)-104(N), where N is a positive integer, via shared communication bus 106. Each of devices 104(1)-104(N) and controller 102 might be desirably assigned a unique address such that commands and data can be broadcast over shared communication bus 106, but processed only by one or more intended recipient devices of devices 104(1)-104(N) and controller 102. In various embodiments, devices 104(1)-104(N) might be implemented as separate individual devices (e.g., in an automotive application, a brake sensor, a gear sensor, a motor sensor, etc.), separate integrated circuits (e.g., a processor, a memory, a sensor, etc.), separate silicon die located in a single integrated circuit (e.g., separate die of a system-on-chip (SoC), etc.), or separate elements of a single silicon die (e.g., separately addressable memories on a single die, etc.). In some embodiments, controller 102 might serve as a master device while devices 104(1)-104(N) serve as slave devices on shared communication bus 106 (e.g., in an automotive application, controller 102 might be an Electronic/Engine Control Unit (ECU) or the Engine Control Module (ECM), etc., and devices 104(1)-104(N) might be various sensors or other subsystems).

Communication bus 106 might commonly be a bidirectional serial bus. For example, communication bus 106 might be implemented as a Local Interconnect Network ("LIN") bus. Thus, system 100 might typically be implemented for automotive applications as shared LIN bus 106 coupling one or more slave devices 104, such as sensors, to a master device 102, such as an ECU or ECM. It will be appreciated that the circuits and techniques described herein may be applied to other types of communication buses.

Figure 2:
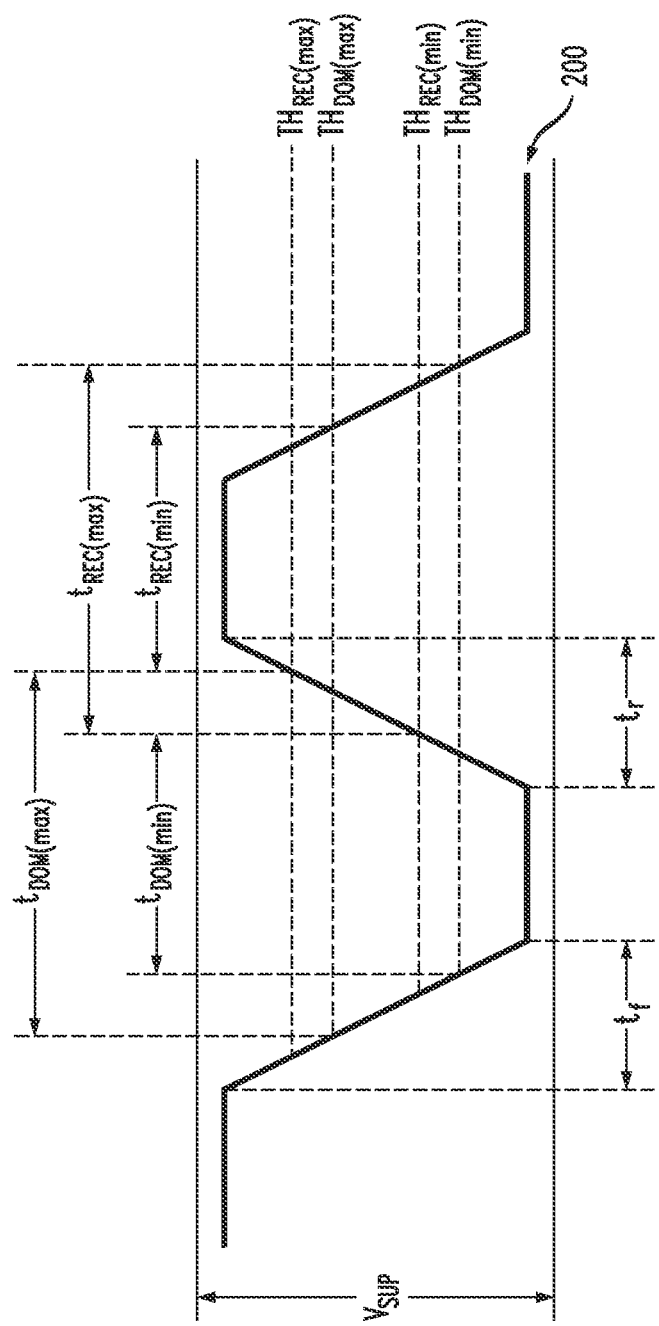
FIG. 2 shows an illustrative timing diagram of a data signal of the bidirectional communication bus of the system shown in FIG. 1.

FIG. 2 shows an illustrative timing diagram of LIN data signal 200 that might be communicated on communication bus 106. As shown in FIG. 2, a LIN data signal 200 has a maximum possible voltage range of $V_{SUP}$, which is the power supply voltage of devices coupled to the LIN bus. As shown in FIG. 2, a threshold voltage for a receiver to detect a logic high signal has a range between a maximum voltage ($TH_{REC(max)}$) and a minimum voltage ($TH_{REC(min)}$). A threshold for a receiver to detect a logic low signal has a range between a maximum voltage ($TH_{DOM(max)}$) and a minimum voltage ($TH_{DOM(min)}$). These thresholds must be met by LIN data signal 200 on communication bus 106. In automotive applications, $V_{SUP}$ is typically slightly less than the voltage of the vehicle battery. For example, LIN bus components (and, thus, $V_{SUP}$) are typically isolated from the vehicle battery by at least one series diode, having a corresponding voltage drop across it, and by one or more series resistors, each resistor also having a corresponding voltage drop across it that varies in proportion to the current through it. The bus voltage might typically be further isolated from $V_{SUP}$ by an additional series diode and pull-up resistor. The low range of the bus voltage might also be slightly higher than ground in the case of a voltage drop across a pull-down semiconductor switching element. Thus, as shown in FIG. 2, the range of LIN data signal 200 is slightly less than the full range of $V_{SUP}$.

In addition, LIN data signal 200 has a rise time, $t_r$, and a fall time, $t_f$, that vary based on electrical attributes of devices coupled to communication bus 106 and electrical attributes of communication bus 106 itself, as well as the manner in which LIN data signal 200 is generated. FIG. 2 also shows illustrative durations for transmitted bits, where $t_{DOM}$ is the duration of a logic low bit, and $t_{REC}$ is the duration of a logic high bit. FIG. 2 also shows illustrative rise ($t_r$) and fall times ($t_f$) for logic transitions of LIN data signal 200. Thus, as shown in FIG. 2, the rise time, $t_r$, and fall time, $t_f$, of LIN data signal 200 should be within the range determined by the maximum and minimum durations for a transmitted bit and maximum rise and fall times as set forth in the LIN specification. Changing the rise time, $t_r$, and fall time, $t_f$, of LIN data signal 200 can change an amount of electromagnetic interference (EMI) present on communication bus 106. Further, changes in the characteristics of communication bus 106, for example load resistance and capacitance, can also change the characteristics of LIN data signal 200.

Figure 3:
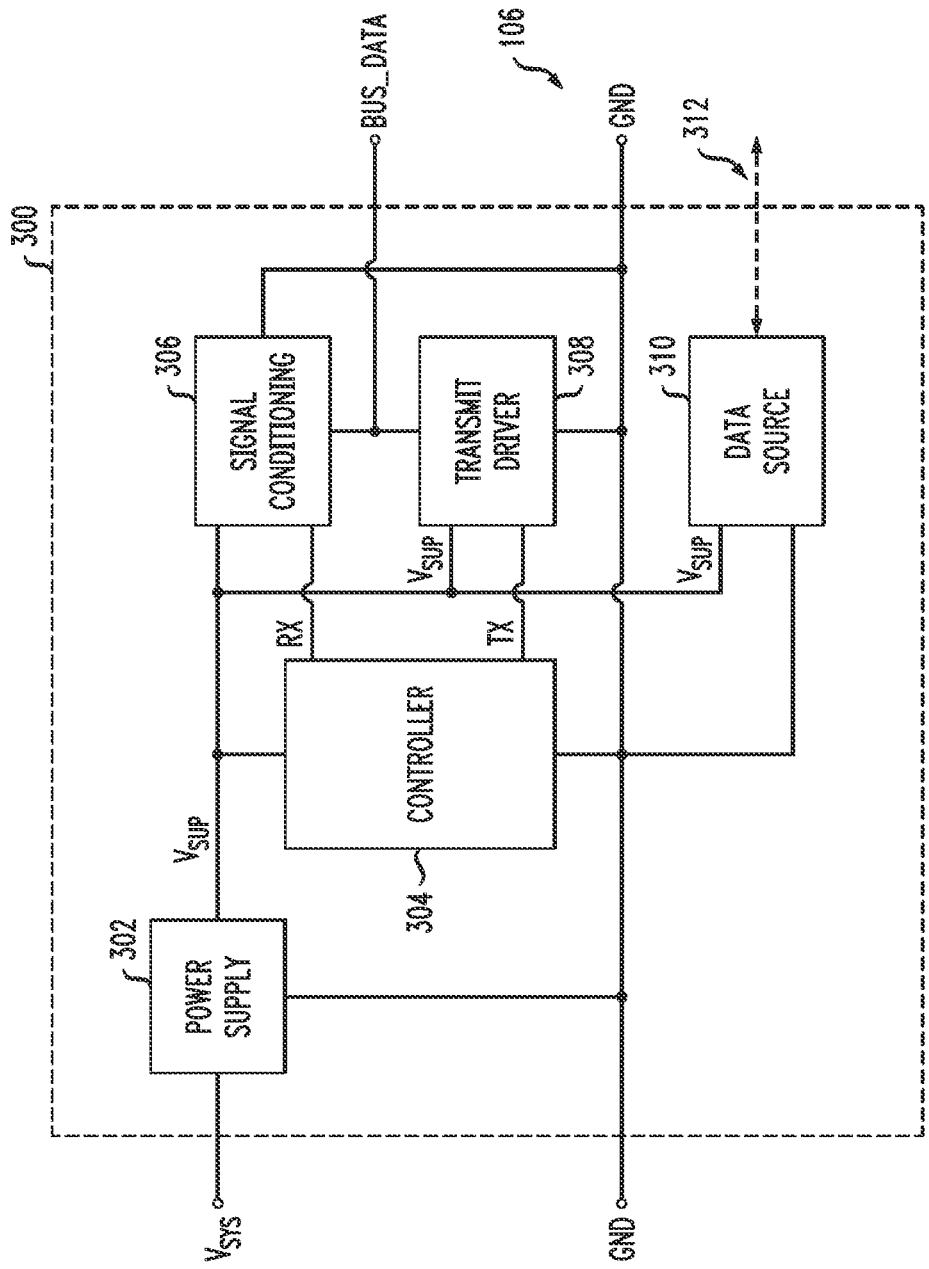
FIG. 3 shows a block diagram of a transceiver of the plurality of devices of the system shown in FIG. 1.

FIG. 3 shows a block diagram of LIN device 300, which might be employed as one or more of devices 104(1)-104(N) of the embodiment shown in FIG. 1. As shown in FIG. 3, LIN device 300 is coupled to an input voltage $V_{SYS}$, a ground or circuit common, GND, and communication bus 106, which includes a data signal shown as the signal or node BUS_DATA and, in some embodiments, a ground or circuit common, GND. LIN device 300 includes power supply 302 that is coupled to $V_{SYS}$ and GND and generates voltage $V_{SUP}$ that, as described in regard to FIG. 2, is the power supply voltage of devices coupled to a LIN bus. $V_{SUP}$ and GND are provided to various components of LIN device 300, including controller 304, signal conditioning module 306, transmit driver 308 and data source 310. In automotive systems, $V_{SYS}$ might be substantially equal to $V_{BATT}$.

Signal conditioning module 306 is coupled to the BUS_DATA signal of communication bus 106, and might filter, sample, or otherwise condition data received by LIN device 300 on the BUS_DATA signal node. Signal conditioning module 306 provides the conditioned data, as received data signal RX, to controller 304. Controller 304 generally controls the operation of LIN device 300, for example by processing data received from communication bus 106 (e.g., received data RX), and generating data to be transmitted on communication bus 106, which is provided to transmit driver 308 as transmit data signal TX. Transmit driver 308 is coupled to the BUS_DATA signal, and drives the voltage level of the BUS_DATA signal based on transmit data signal TX. Controller 304 might generate transmit data signal TX in response to data provided from data source 310.

In some embodiments, data source 310 might be in communication with one or more devices external to LIN device 300 via communication path 312. Communication path 312 might be a wired or wireless connection. Data source 310 might be implemented as various sensors or input/output devices. For example, in some embodiments, LIN device 300 might be a magnetic field sensor and, in such embodiments, data source 310 might include one or more magnetic field sensing elements to detect parameters of a magnetic field, for example in response to the presence or movement of a ferromagnetic or magnetic object.

As used herein, the term "magnetic field sensing element" is used to describe a variety of electronic elements that can sense a magnetic field for example, but not limited to, a Hall effect element, a magnetoresistance element, or a magnetotransistor. As used herein, the term "magnetic field sensor" is used to describe a circuit that uses a magnetic field sensing element, generally in combination with other circuits (e.g., LIN device 300). Magnetic field sensors are used in a variety of applications, including, but not limited to, angle sensors that sense an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a linear magnetic field sensor that senses a magnetic field density of a magnetic field.

Described embodiments might desirably operate communication bus 106 as a LIN bus in an open-loop mode. As will be described, some embodiments of transmit driver 308 employ a current mirror circuit to generate a shaped current waveform to charge and discharge communication bus 106 in an open-loop operation mode. As will be described, in embodiments where the current mirror circuit employs bipolar junction transistors (BJTs), the current waveform that charges and discharges the LIN bus (e.g., the BUS_DATA signal) is exponential versus time (e.g., the current through the transistor (e.g., the collector-emitter current) is related exponentially to the base-emitter voltage of the transistor (e.g., $V_{BE}$)). In embodiments where the current mirror circuit employs metal oxide semiconductor field effect transistors (MOSFETs), the current waveform that charges and discharges the LIN bus (e.g., the BUS_DATA signal) follows a square-law relationship (e.g., the current through the transistor (e.g., the drain-source current) is related to the gate-source voltage-squared (e.g., $V_{GS}^2$)).

As will be described, when the BUS_DATA signal is driven high-to-low by transmit driver 308, current is drawn through the current mirror circuit from communication bus 106 to discharge the BUS_DATA signal. Regardless of whether the current mirror circuit employs MOSFETs (e.g., current related to gate-source voltage squared) or BJTs (e.g., current exponentially related to base-emitter voltage), when the BUS_DATA signal is driven from high-to-low, the current sunk from communication bus 106 starts as a small current and gradually increases before increasing rapidly (e.g., increases exponentially in the case of BJTs used in the current mirror, or increases based on the square-law for MOSFETs). If communication bus 106 has low resistance and/or low load capacitance, the BUS_DATA voltage will decrease more quickly than if communication bus 106 has higher resistance or higher load capacitance. When communication bus 106 has low resistance and/or low load capacitance, most of the bus discharging occurs during the linear region of the current waveform (e.g., very quickly). When communication bus 106 has high resistance and/or high load capacitance, the voltage will decrease less quickly and thus most of the bus discharging occurs during the non-linear part of the current waveform. This is preferable to a single-value or linearly ramped current as the timings (e.g., the rise and fall times and, thus, the bit duty cycles), can be more accurately controlled over variances in load conditions without generating increased EMI.

When the BUS_DATA signal is driven low-to-high by transmit driver 308, the current draw through the current mirror circuit is turned off. Regardless of whether the current mirror circuit employs MOSFETs (e.g., current related to gate-source voltage squared) or BJTs (e.g., current exponentially related to base-emitter voltage), when the BUS_DATA signal is driven from low-to-high, the current sunk from communication bus 106 starts as a large current and decreases rapidly before decreasing more gradually (e.g., decreases exponentially in the case of BJTs used in the current mirror, or decreases based on the square-law for MOSFETs). If communication bus 106 has low resistance and/or low load capacitance, the BUS_DATA voltage will increase more quickly than if communication bus 106 has higher resistance or higher load capacitance.

Figure 4:
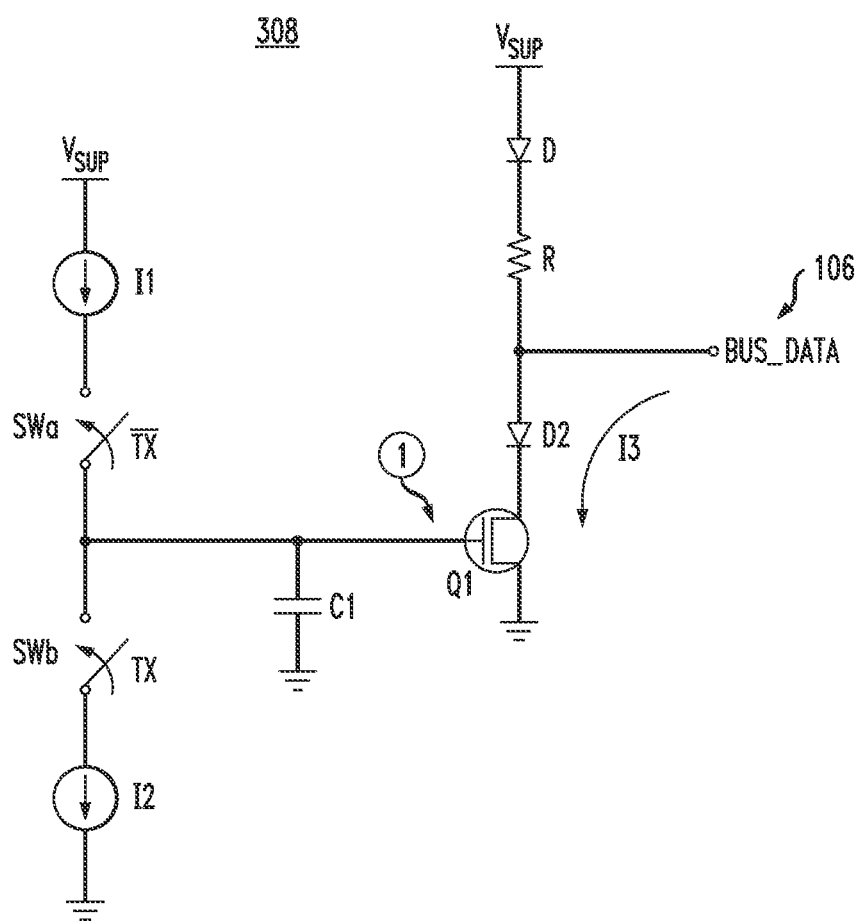
FIG. 4 shows a schematic diagram of a transmitter portion of the transceiver shown in FIG. 3.

FIG. 4 is a schematic of an illustrative embodiment of transmit driver 308. As shown in FIG. 4, transmit driver 308 is coupled to the BUS_DATA signal of communication bus 106. The BUS_DATA signal is coupled to an input node of transistor Q1 and the cathode of diode D.

As used herein, the terms "input node" and "output node" refer generically to either the source or drain of a metal-oxide semiconductor (MOS) field effect transistor (also referred to as a MOSFET) or the emitter or collector of a bi-polar junction transistor (also referred to as a BJT), and the term "control node" refers generically to the gate of the MOSFET or the base of the BJT. Similarly, as used in the claims, the terms "source," "drain," and "gate" should be understood to refer either to the source, drain, and gate of a MOSFET or to the emitter, collector, and base of a bi-polar device for embodiments employing bi-polar transistor technology.

Diode D is coupled in series between supply voltage $V_{SUP}$ and resistor R, with the anode of diode D coupled to $V_{SUP}$ and the cathode of diode D coupled to resistor R. As would be appreciated by one of skill in the art, the order of resistor R and diode D might be exchanged without changing the operation of the circuit. A control node of transistor Q1 is coupled to Node 1. An output node (e.g., the source) of transistor Q1 is coupled to GND. The anode of diode D2 is coupled to BUS_DATA, and the cathode of diode D2 is coupled to an output node (e.g., the drain) of transistor Q1. Thus, resistor R and diode D operate to charge or pull-up the BUS_DATA signal to approximately the voltage of $V_{SUP}$ (e.g., $V_{SUP}$ less the voltage drop across resistor R and diode D). Further, diode D2 and transistor Q1 operate, in response to the signal at Node 1, to controllably discharge or pull-down the BUS_DATA signal to approximately the voltage of GND (e.g., GND plus the voltage across transistor Q1, e.g., the drain-to-source voltage, $V_{DS}$, in embodiments where Q1 is a metal-oxide semiconductor field effect transistor (MOSFET), such as shown in FIG. 4). By controlling turn-off of transistor Q1, described embodiments shape the rise time on the BUS_DATA signal.

The voltage of Node 1 and, thus, the voltage of the control node of transistor Q1, is controlled by current sources I1 and I2 and switches SWa and SWb. Switches SWa and SWb operate in response to transmit data signal TX. As shown, switch SWa is closed (e.g., on) when transmit data signal TX is logic low and open (e.g., off) when TX is logic high (e.g., the logic of SWa is the inverse of TX, shown as $\overline{TX}$). Switch SWb is closed (e.g., on) when transmit data signal TX is logic high and open (e.g., off) when TX is logic low (e.g., the logic of SWb is the same as the logic of TX). Thus, when transmit data signal TX is logic high, switch SWa is open and SWb is closed, and Node 1 (e.g., the control node of transistor Q1) is discharged by current source I2. Similarly, when transmit data signal TX is logic low, switch SWa is closed and SWb is open, and Node 1 (e.g., the control node of transistor Q1) is charged by current source I1.

In embodiments in which transistor Q1 is an NFET (as shown in FIG. 4) or an N-type BJT (not shown), discharging the control node of transistor Q1 results in decreasing the current flowing through transistor Q1, shown as current I3. As Node 1 is increasingly discharged, current I3 approaches zero, and transistor Q1 is turned "off", and the BUS_DATA signal charges from $V_{SUP}$ through resistor R and diode D. Therefore, turning off transistor Q1 allows transmit driver 308 to transmit a logic high on the BUS_DATA signal of communication bus 106. Controlling the rate at which transistor Q1 is turned off by controlling the speed at which Node 1 is discharged (e.g., by controlling I2) allows control of how fast the BUS_DATA signal can charge (e.g., by controlling I3). As described above, when Q1 is a MOSFET, current I3 is related to Q1's gate-source voltage squared.

Congruently, when transistor Q1 is an NFET (as shown in FIG. 4) or an N-type BJT, charging the control node of transistor Q1 results in increasing the current flowing through transistor Q1, current I3. As Node 1 is increasingly charged, current I3 increases, and transistor Q1 is "on". When transistor Q1 is on, the BUS_DATA signal discharges through transistor Q1, and therefore, turning on transistor Q1 allows transmit driver 308 to transmit a logic low on the BUS_DATA signal of communication bus 106. Controlling the rate at which transistor Q1 is turned on by controlling the speed at which Node 1 is charged (e.g., by controlling I1) allows control of how fast the BUS_DATA signal can discharge (e.g., by controlling I3). As described above, when Q1 is a BJT, current I3 is related exponentially to Q1's base-emitter voltage.

It should be appreciated that the logic of switches SWa and SWb could be reversed if transistor Q1 were implemented as a PFET or P-type BJT. Further, switches SWa and SWb could be implemented as mechanical switches or as one or more transistors or other semiconductor switching elements (e.g., triacs, thyristors, silicon controlled rectifiers (SCRs), etc.).

By controlling the rate of charge and discharge of the BUS_DATA signal, transmit driver 308 can beneficially control the bit durations (e.g., $t_{DOM}$ and $t_{REC}$), rise time, $t_r$, and fall time, $t_f$, of the BUS_DATA signal, as well reduce the amount of EMI that is generated by LIN device 300 and coupled to communication bus 106. Further, embodiments employing components that exhibit both linear and non-linear properties (e.g., transistors) allow for increased control of the rate of charge and discharge of the BUS_DATA signal, as will be described in greater detail below.

Figure 5:
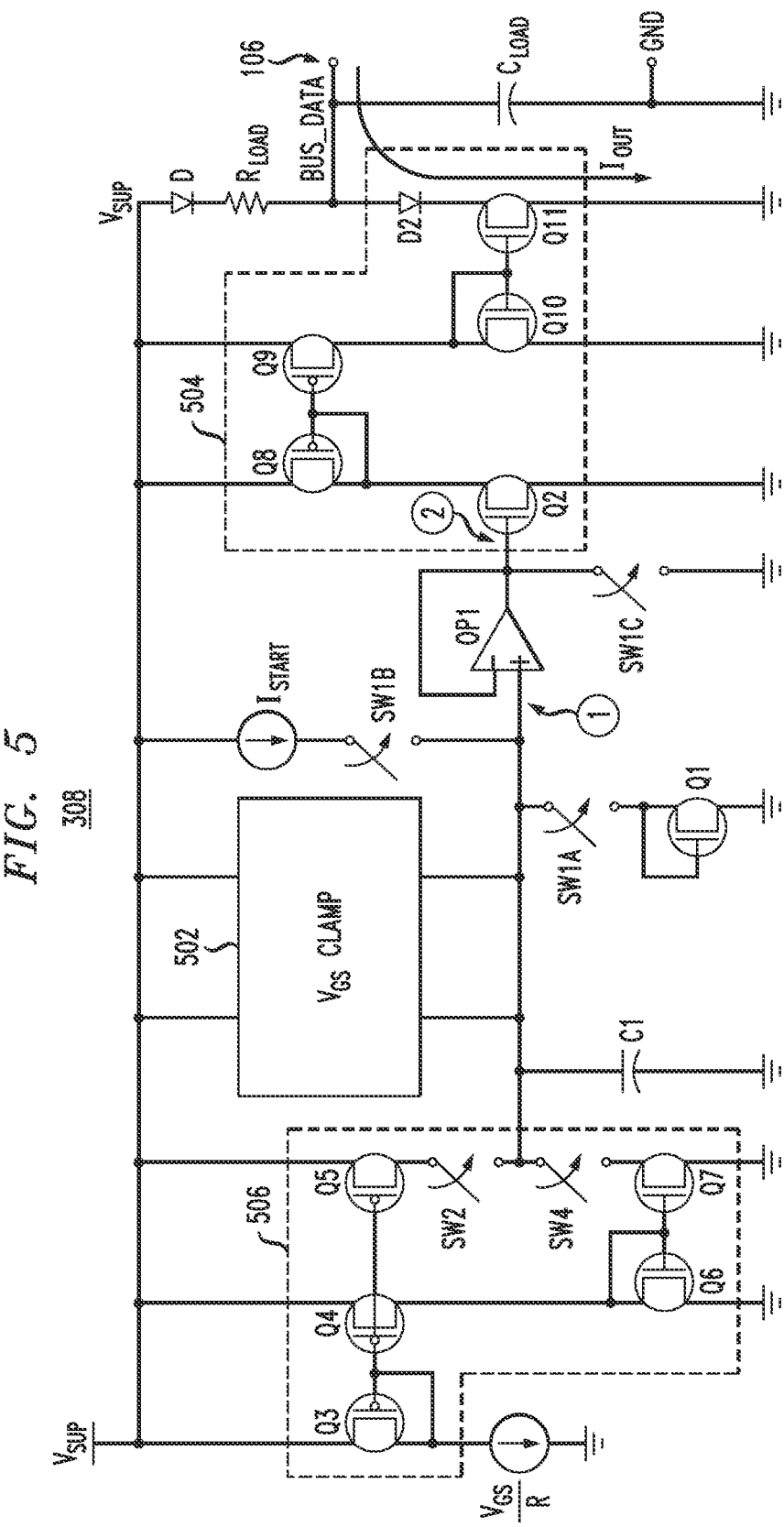
FIG. 5 shows additional detail of the transmitter shown in FIG. 4.

FIG. 5 shows additional detail of transmit driver 308. As shown in FIG. 5, some embodiments of transmit driver 308 might desirably employ an actively driven current mirror circuit to charge and discharge the BUS_DATA signal.

As shown in FIG. 5, current mirror circuit 504 is formed by transistors Q8, Q9, Q10 and Q11. Transistors Q8 and Q9, and transistors Q10 and Q11 form current mirror pairs of current mirror circuit 504. For the embodiment shown in FIG. 5, transistors Q8 and Q9 are P-channel FETs and transistors Q2, Q10 and Q11 are N-channel FETs. However, in other embodiments, transistors Q8 and Q9 might be N-channel FETs and transistors Q2, Q10 and Q11 might be P-channel FETs. In yet other embodiments, transistors Q2, Q8, Q9, Q10 and Q11 might be BJTs. For simplicity, only the embodiment shown in FIG. 5 will be described herein, although one of skill in the art will appreciate how to implement transistors Q2, Q8, Q9, Q10 and Q11 as different types of transistors or as transistors having different doping.

Current mirror circuit 504 is actively driven by operational amplifier (op amp) OP1. The non-inverting input of op amp OP1 is designated as Node 1, and the output of op amp OP1 is designated as Node 2. The output of op amp OP1 (e.g., Node 2) is fed back to the inverting input of op amp OP1. Node 2 is also coupled to switch SW1c, which is coupled between Node 2 and ground. Node 2 provides the control input to current mirror circuit 504 by being coupled to the control node of transistor Q2 (e.g., the gate of MOSFET Q2). The drain of transistor Q2 is coupled to the drain of transistor Q8. The source of transistor Q2 is coupled to ground. The output of current mirror 504 is the BUS_DATA signal coupled to communication bus 106.

As shown in FIG. 5, the input nodes of transistors Q8 and Q9 are coupled to $V_{SUP}$ (e.g., the source nodes of the P-channel FETs are coupled to $V_{SUP}$). To form the first current mirror pair, the gates of transistors Q8 and Q9 are coupled to each other and also coupled to a node between transistors Q8 and Q2 (e.g., the drain of transistor Q8 and the drain of transistor Q2). The drain of transistor Q10 is coupled to the drain of transistor Q9. To form the second current mirror pair, the gates of transistors Q10 and Q11 are coupled to each other and also coupled to a node between transistors Q9 and Q10 (e.g., the drain of transistor Q9 and the drain of transistor Q10). The drain of transistor Q11 is coupled to the BUS_DATA signal and to $V_{SUP}$ through resistor $R_{LOAD}$. The source of transistor Q11 is coupled to ground. The BUS_DATA signal is also coupled to load capacitance $C_{LOAD}$. Although not shown in FIG. 5, in embodiments where communication bus 106 is a LIN bus, a diode might be in series with $R_{LOAD}$ (e.g., diode D shown in FIG. 4). In LIN implementations, a diode might be placed in series with transistor Q11 (e.g., with the anode coupled to BUS_DATA and the cathode coupled to the drain of Q11, shown as diode D2 in FIGS. 4 and 5).

Thus, as shown in FIG. 5, the current through transistor Q2 controls the current through transistor Q9, which in turn controls the current through transistor Q11. In some embodiments, the current through transistor Q11 might be a multiple of the current through transistor Q2. The current through transistor Q11, Iour, in turn, determines the rate of charge or discharge of the BUS_DATA signal. Transistor Q2 is driven by op amp OP1 (e.g., by controlling Node 2). As will be described, the operation of op amp OP1 is controlled based on the operation of $V_{GS}$ clamp circuit 502, capacitor C1, transistors Q3, Q4, Q5, Q6 and Q7, and switches SW2, SW4, SW1A, and SW1B (e.g., by controlling Node 1).

Node 1 is coupled to current source $I_{START}$ via switch SW1B, and also coupled to transistor Q1 via switch SW1A. Capacitor C1 is coupled between ground and Node 1 to control charge and discharge of Node 1. Node 1 is also coupled to the drains of transistors Q5 and Q7 via switches SW2 and SW4, respectively.

Current mirror circuit 506 includes transistors Q3, Q4, Q5, Q6 and Q7. Transistor Q3 is coupled, source-to-drain, between $V_{SUP}$ and current $$\frac{V_{GS}}{R}.$$

The control node of transistor Q3 is coupled to the drain of Q3, and to the control nodes of transistors Q4 and Q5. In some embodiments, the control node of transistors Q3, Q4 and Q5 might be coupled to controller 304 (FIG. 3), for example to enable transmit driver 308 to drive the BUS_DATA signal in response to transmit data (e.g., transmit data signal TX). Transistor Q4 is coupled, source-to-drain, between $V_{SUP}$ and the drain and control node of transistor Q6. The source of transistor Q6 is coupled is coupled to ground. The control node of transistor Q6 is also coupled to the control node of transistor Q7. The source of transistor Q7 is coupled to ground. The source of transistor Q5 is coupled to $V_{SUP}$, and the drain of transistor Q5 is coupled to switch SW2, which selectively couples the drain of transistor Q5 to Node 1. The drain of transistor Q7 is coupled to switch SW4, which selectively couples the drain of transistor Q7 to Node 1. Thus, transistors Q3, Q4, Q5, Q6 and Q7 collectively form current mirror circuit 506, which drives op amp OP1 (e.g., Node 1) and, in turn, drives current mirror 504 to charge and discharge capacitor C1 and, in turn, the BUS_DATA signal to transmit data on communication bus 106.

Figure 6:
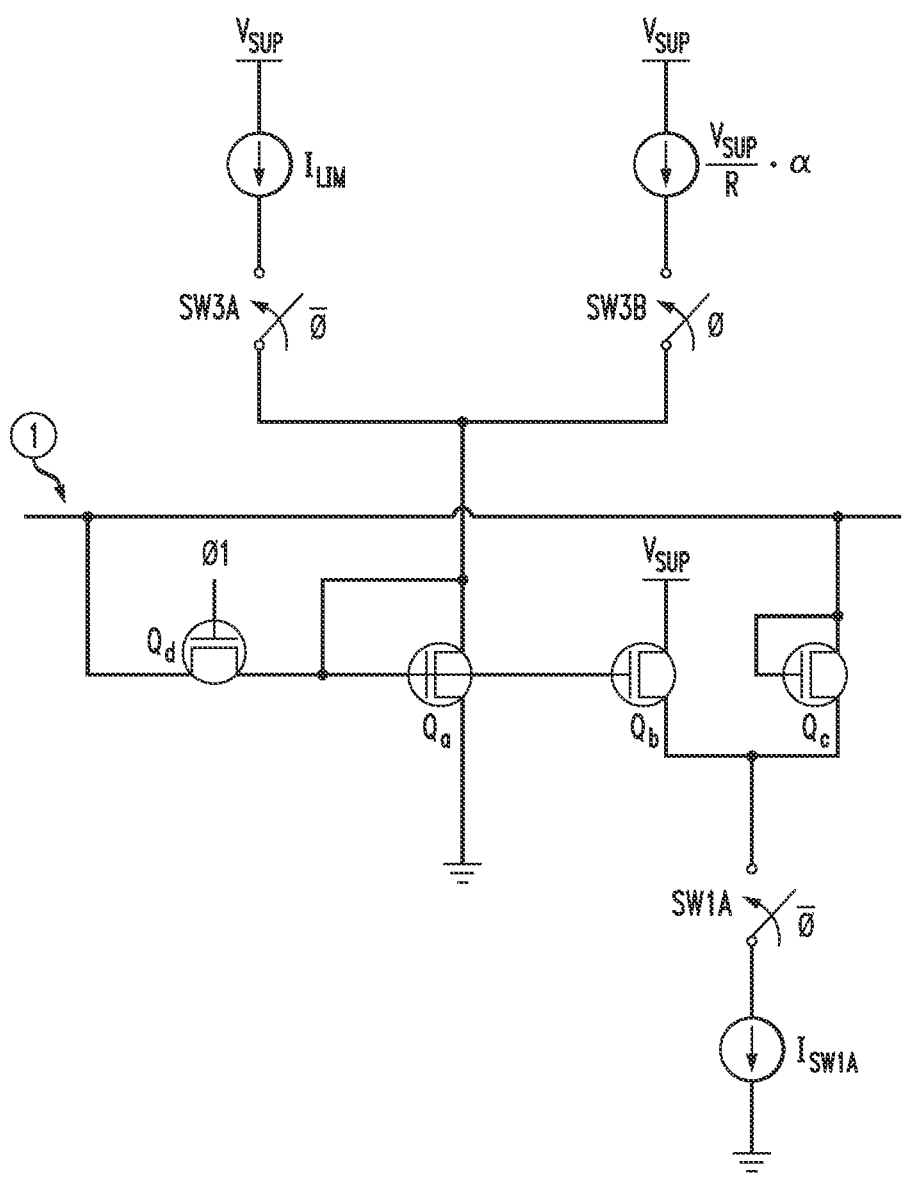
FIG. 6 shows a detailed schematic diagram of a clamp circuit of the transmitter shown in FIG. 5.

Node 1 is also coupled to $V_{GS}$ clamp circuit 502. FIG. 6 shows an embodiment of $V_{GS}$ clamp circuit 502. As shown, $V_{GS}$ clamp circuit 502 might include a first current source, $I_{LIM}$, and a second current source, $$\frac{V_{SUP}}{R} \cdot \alpha.$$

The current sources are coupled to $V_{SUP}$ and transistor $Q_a$ via switches SW3A and SW3B, respectively. As shown, switches SW3A and SW3B operate in response to control signal ϕ. As shown, switch SW3A is closed (e.g., on) when control signal ϕ is logic low and open (e.g., off) when control signal ϕ is logic high (e.g., the logic of SW3A is the inverse of control signal ϕ, shown as ($\overline{\varphi}$)). Switch SW3B is closed (e.g., on) when control signal ϕ is logic high and open (e.g., off) when control signal ϕ is logic low (e.g., the logic of SW3B is the same as the logic of control signal ϕ).

$V_{GS}$ clamp circuit 502 also includes transistors $Q_b$ and $Q_c$. Transistor $Q_b$ is coupled, drain-to-source, between $V_{SUP}$ and ground through switch SW1A. Transistor $Q_c$ is coupled, drain-to-source, between Node 1 and ground through switch SW1A. Switch SW1A operates in response to control signal $\overline{\varphi}$. The control node of transistor $Q_b$ is coupled to the control node of transistor $Q_a$, which is coupled to an input node of transistor $Q_d$. The control node of transistor $Q_c$ is coupled to Node 1.

Thus, when control signal ϕ is logic high, switch SW3A is open and SW3B is closed, thus connecting current source $$\frac{V_{SUP}}{R} \cdot \alpha$$

to transistor $Q_a$, which is coupled, through transistor $Q_d$, to Node 1. Transistor $Q_d$ is controlled by control signal ϕ, such that when control signal ϕ is logic high, transistor $Q_d$ is on, and when control signal ϕ is logic low, transistor $Q_d$ is off. Thus, when control signal ϕ is logic high, Node 1 is charged by current source $$\frac{V_{SUP}}{R} \cdot \alpha,$$

which current is fed in transistor $Q_a$, which clamps Node 1 to the same voltage as the $V_{GS}$ voltage of transistor $Q_a$.

Similarly, when control signal ϕ is logic low, switch SW3A is closed and SW3B is open, thus connecting current source $I_{LIM}$ to transistor $Q_a$. Transistor $Q_d$ is off when control signal ϕ is logic low. $I_{LIM}$ is coupled to the gate of transistors $Q_a$ and $Q_b$. When control signal ϕ is logic low, switch SW1A is closed, and Node 1 is discharged by the current through transistor $Q_c$ if the voltage on node 1 rises higher than the $V_{GS}$ voltage of transistor $Q_a$. The current through transistor $Q_b$, is based on current $I_{LIM}$, and the current through transistor $Q_c$ is based on the voltage of Node 1 (e.g., varies as the voltage of Node 1 varies, such that when Node 1 is charged to a higher voltage level, the current through transistor $Q_c$ is high, and as Node 1 discharges, the current through transistor $Q_c$ decreases). The maximum current through transistors $Q_b$ and $Q_c$ is limited to the current through SW1A. Thus, transistor $Q_c$ clamps the voltage of Node 1 and limits the output current (e.g., $I_{OUT}$). The current through transistor $Q_c$ is limited by current $I_{SW1A}$ (shown as transistor Q1 in FIG. 5). In some embodiments, current $I_{SW1A}$ is slightly larger than the current $$\frac{V_{GS}}{R}$$

(shown in FIG. 5).

Thus, as described, $V_{GS}$ clamp circuit 502 provides a constant maximum current limit (e.g., $I_{LIM}$). Further, $V_{GS}$ clamp circuit 502 provides current source $$\frac{V_{SUP}}{R} \cdot \alpha$$

that clamps the voltage of Node 1 to the gate-to-source voltage, $V_{GS}$, of transistor $Q_a$. Thus, current $$\frac{V_{SUP}}{R} \cdot \alpha$$

might prevent an overcurrent condition at $I_{OUT}$ (e.g., by clamping the voltage of Node 1). Transmit driver 308 provides current $$\frac{V_{GS}}{R}$$

to linearly charge and discharge Node 1, which in turn charges and discharges Node 2. As shown in FIG. 5, when Node 1 is discharged (e.g., a logic low), Node 2 is a logic low, which means that the BUS_DATA signal is charged (e.g., a logic high). When Node 2 is a logic high, the BUS_DATA signal is discharged (e.g., a logic low).

Thus, $V_{GS}$ clamp circuit 502 limits the maximum output current (e.g., $I_{OUT}$) based on current him, and clamps the voltage of Node 1 in preparation of charging the BUS_DATA signal based on current $$\frac{V_{SUP}}{R} \cdot \alpha.$$

In particular, current $$\frac{V_{GS}}{R}$$

linearly charges and discharges Node 1 due to the capacitor C1. Due to the square-law (MOSFET) or exponential (BJT) relationship of the currents of the transistors in current mirror circuit 504 (particularly the current through transistor Q2), the BUS_DATA signal is non-linearly charged and discharged. The signal at Node 1 is buffered by op amp OP1 to provide the signal at Node 2, which open-loop drives the gate voltage of transistor Q2 in order to generate a current that is amplified by current mirror 504 and used to charge or discharge communication bus 106, for example by controlling the rate BUS_DATA can charge through resistor $R_{LOAD}$ and diode D by controlling the current, $I_{OUT}$, through transistor Q11. In some embodiments, transistors Q1 and Q2 are matched to the transistors of $V_{GS}$ clamp circuit 502 that generate current $$\frac{V_{SUP}}{R} \cdot \alpha$$

(e.g., transistors $Q_a$, $Q_b$ and $Q_c$ of FIG. 6) and also matched to the transistors that generate current $$\frac{V_{GS}}{R}.$$

In operation, a pre-charge voltage, $V_{MIN}$, of Node 1 is set by current $I_{START}$ being fed to Node 1. Current $I_{START}$ is a small current that pre-charges Node 1 such that the output current, $I_{OUT}$, present on the BUS_DATA node can be increased quickly but without having a sudden or sharp edge or spike, which could increase EMI. In an illustrative embodiment, $I_{START}$ might be approximately 1 μA. A maximum voltage, $V_{MAX}$, of Node 1 is set by $V_{GS}$ clamp circuit 502 that clamps Node 1 to a voltage equal to the voltage produced from the current fed into transistor $Q_a$, which, in turn, sets the clamp voltage via transistors $Q_b$ and $Q_c$. Thus, Node 1 varies over the range of $V_{MIN}$ to $V_{MAX}$ and the current to Node 1 varies between 0, $I_{START}$, $$\frac{V_{SUP}}{R} \cdot \alpha$$

and $I_{LIM}$.

In described embodiments, to minimize the delay in low-to-high transitions of BUS_DATA, the current of $V_{GS}$ clamp circuit 502 is changed to a scaled current related to $V_{SUP}/R_{LOAD}$, shown in FIG. 6 as current $$\frac{V_{SUP}}{R} \cdot \alpha,$$

with a minimum value of $R_{LOAD}$ selected. If a maximum value of $R_{LOAD}$ is chosen and the actual load resistance is less, a voltage step would result which is undesirable, for example for EMI.

As described herein, when transmit data signal TX goes high, the BUS_DATA signal also goes high and, congruently, when transmit data signal TX goes low, the BUS_DATA signal also goes low. FIGS. 7 and 8 illustrate the relationship between the signals described in regard to FIGS. 5 and 6 over an elapsed time, t. FIG. 7 shows the signals over a time, t, that includes multiple transitions (e.g., multiple cycles) of transmit data signal TX. FIG. 8 shows the signals over a time, t, that includes a single cycle (e.g., one low-to-high transition and one high-to-low transition) of transmit data signal TX.

In FIGS. 7 and 8, curve 702 illustrates transmit data signal TX, curve 704 illustrates the voltage of the BUS_DATA signal, curve 706 represents the current (e.g., current $I_{OUT}$ of FIG. 5) of the BUS_DATA signal (e.g., the current flowing into and out of LIN device 300 at the BUS_DATA node), curve 708 represents the voltage on Node 1 (hashed line) and the voltage on Node 2 (solid line), and curves 710(1), 710(2), 710(3) and 710(4) represent the logic state (e.g., logic high is "on" or closed, and logic low is "off" or open) of switches SW1 (which includes switches SW1A, SW1B and SW1C), SW2, SW3 (which includes switches SW3A and SW3B shown in FIG. 6) and SW4, respectively.

As shown in FIGS. 7 and 8, described embodiments incur five distinct activity periods on Node 1 in response to transmit data signal TX, shown in FIGS. 7 and 8 as activity periods A, B, C, D and E. As will be described in greater detail below, activity periods A and B correspond to low-to-high transitions of transmit data signal TX (e.g., the BUS_DATA signal). Activity period C occurs before, and in preparation of, a high-to-low transition of transmit data signal TX. Activity periods D and E correspond to high-to-low transitions of transmit data signal TX (e.g., the BUS_DATA signal).

For a low-to-high transition of transmit data signal TX and, thus, the BUS_DATA signal, during activity period A the voltage of Node 1 is set to a predetermined level by a pre-charge current feeding transistor $Q_a$. More particularly, for a very short time, shown in FIG. 8 as time TA, in response to transmit data signal TX going high, Node 1 and Node 2 are set to a voltage equal to $V_{GS}$ by a current $$\frac{V_{SUP}}{R} \cdot \alpha$$

by $V_{GS}$ clamp circuit 502 (e.g., switch SW3B is closed). This pre-charges Node 1 and Node 2, thus starting to turn off transistor Q11 and reducing the pull-down current $I_{OUT}$. Reducing the pull-down current $I_{OUT}$ allows the BUS_DATA signal to start to charge up soon after transmit data signal TX goes high, minimizing delay in the response of the BUS_DATA signal. Further, gradually reducing the pull-down current $I_{OUT}$ allows the BUS_DATA signal to charge without causing EMI, such as might be caused by suddenly reducing the pull-down current $I_{OUT}$ to zero.

FIG. 9 shows a flow diagram of operation technique 900 employed by LIN device 300. At block 902, a transceiver of LIN device 300 starts to operate. For example, the transceiver might include transmit driver 308 and signal conditioning module 306, both of which are coupled to controller 304.

At block 904, one or more transceiver attributes (e.g., operating settings of signal conditioning module 306 and/or operating settings of transmit driver 308) might optionally be calibrated based on, for example, estimated channel characteristics of communication bus 106. For example, received signals might be corrupted by frequency-dependent signal loss of the channel, inter-symbol interference (ISI), EMI and other noise, such as crosstalk, echo, signal dispersion and distortion. Thus, receivers might equalize the channel to compensate for such distortions. Equalization might be performed by one or more equalizers or filters, such as a decision-feedback equalizer (DFE) and a continuous time analog equalizer (AEQ), which might be employed to remove inter-symbol interference and other noise. Parameters of AEQs might be adapted based on channel characteristics, such as channel loss or transfer function, and parameters of DFEs might be adapted based on previously decided symbols. Equalizer parameters that can be adapted might include, for example, a number of active filter taps, weight coefficients of each active filter tap, variable component values to set filter characteristics such as frequency response or an order of the filter, values of components of a matching network, etc.

For example, in some embodiments, channel characteristics might be estimated based upon one or more calibration signals received by signal conditioning module 306 from communication bus 106. For example, a predetermined (e.g., known) calibration signal might be provided over communication bus 106. Comparing the received data to the known calibration data, controller 304 might optionally adjust one or more settings of signal conditioning module 306 to improve the quality of the received data. Similarly, settings of transmit driver 308 might be adjusted to calibrate, for example, the charge and discharge time of the BUS_DATA signal of transmit driver 308.

At block 908, LIN device 300 operates in a receive mode (e.g., transmit driver 308 is not transmitting data on the BUS_DATA signal, and signal conditioning module 306 waits to receive data on the BUS_DATA signal). Signal conditioning module 306 processes any data received on the BUS_DATA signal, and provides the processed received data to controller 304. At block 910, if controller 304 has data to transmit, then at block 912, LIN device 300 is operated in transmit mode. Otherwise, if there is no data to transmit at block 910, technique 900 returns to block 908, where LIN device 300 operates in receive mode.

FIG. 10 shows additional detail of transmit mode block 912 of FIG. 9. At block 1002, transmit mode 912 begins, for example when controller 304 determines there is data to send on communication bus 106. To send data over communication bus 106, transmit driver 308 asserts high or low signal levels on the BUS_DATA signal. At block 1004, if transmit driver 308 needs to transition the BUS_DATA signal from low-to-high, then processing continues to block 1006.

At block 1006, the voltage (or bias level) of Node 1 is set to a predetermined initial bias level (corresponding to activity period A shown in FIGS. 7 and 8). During activity period A, the voltage of Node 1 is set to a predetermined level by a pre-charge current. More particularly, for a very short time, shown in FIG. 8 as time TA, in response to transmit data signal TX going high, Node 1 and Node 2 are set to a reduced voltage equal to $V_{GS}$ by a current $$\frac{V_{SUP}}{R} \cdot \alpha$$

by VGS clamp circuit 502 (e.g., switch SW3B is closed). This sets the voltages of Node 1 and Node 2 to a level less than their maximum voltages, thus starting to turn off transistor Q11, reducing the pull-down current $I_{OUT}$, and increasing the BUS_DATA voltage. Reducing the pull-down current $I_{OUT}$, allows the BUS_DATA signal to start to charge up soon after transmit data signal TX goes high, minimizing delay in the response of the BUS_DATA signal. Further, gradually reducing the pull-down current $I_{OUT}$, allows the BUS_DATA signal to charge without causing EMI, such as might be caused by suddenly reducing the pull-down current $I_{OUT}$ to zero.

At block 1008, the voltage (or bias level) of Node 1 is linearly reduced to a minimum voltage level over time period $T_B$ corresponding to activity period B shown in FIGS. 7 and 8. During this period, Node 1 is discharged by a current based on current $$\frac{V_{GS}}{R}.$$

In some embodiments, time period $T_B$ might be set based upon the value of $R_{LOAD}$. In other embodiments, time period $T_B$ might be set based upon one or more determined characteristics of communication bus 106 (e.g., at optional step 904 shown in FIG. 9).

For example, Node 1 is linearly discharged by current $$\frac{V_{GS}}{R}.$$

Due to the square-taw (MOSFET) or exponential (BJT) relationship of the currents of transistor Q2 that is mirrored in the current mirror circuit, the BUS_DATA signal is non-linearly charged as the BUS_DATA discharge current (e.g., $I_{OUT}$) is reduced during activity period B. The current through transistor Q11 (e.g., $I_{OUT}$) is non-linearly reduced, thus allowing charging of BUS_DATA through the R-C network including $R_{LOAD}$ and $C_{LOAD}$.

The voltage of BUS_DATA reaches a maximum voltage (e.g., approximately $V_{SUP}$) as the BUS_DATA discharge current $I_{OUT}$ reaches, and is maintained at, zero. Thus, during activity periods A and B, provides a variable charging rate of the BUS_DATA signal based on the initial bias current (activity period A) and current $$\frac{V_{GS}}{R}$$

(activity period B). After block 1008, processing continues to block 1014.

At block 1004, if transmit driver 308 needs to transition the BUS_DATA signal from high-to-low, then processing continues to block 1010. At block 1010, Node 1 is "pre-charged" (e.g., charged prior to a low-to-high transition in transmit data signal TX) to a start voltage such that a sudden edge of BUS_DATA does not occur but there is also not a delay in discharging the BUS_DATA signal. As shown in FIG. 5, switch SW1B is closed at block 1010 to pre-charge Node 1 by current $I_{START}$ (e.g., a predetermined minimum start current to set a predetermined minimum pre-charge bias level of Node 1 into a gate-drain connected FET, e.g., transistor Q1).

The pre-charging occurs for a time, $T_C$, corresponding with activity period C shown in FIGS. 7 and 8. During this time, $T_C$, the internal nodes of the output power stage (e.g., circuit 506 and op amp OP1) are pre-charged in order to minimize delay in the output waveform upon the high-to-low transition of transmit data signal TX.

As shown in FIG. 8, during activity period C (e.g., time $T_C$), Node 2 remains low (e.g., off) even while Node 1 is pre-charged, for example due to switch SW1C being closed until transmit data signal TX goes low. Thus, when transmit data signal TX does transition low, at activity period D, switch SW1C is opened, and Node 2 jumps to the precharge level of Node 1, allowing current $I_{OUT}$ to be increased quickly but without jumping to a large current draw for $I_{OUT}$, and, thus allowing the BUS_DATA voltage to start decreasing quickly but having a rounded edge to prevent EMI.

During activity period D, lasting for time $T_D$, Node 1 and Node 2 charge linearly to a maximum voltage level over time period $T_D$. The charge current might be a scaled version of current $$\frac{V_{GS}}{R}$$

shown in FIG. 5. In some embodiments, time period $T_D$ might be set based upon the value of $R_{LOAD}$. In other embodiments, time period $T_D$ might be set based upon one or more determined characteristics of communication bus 106 (e.g., at optional step 904 shown in FIG. 9). Due to the square-law (MOSFET) or exponential (BJT) relationship of the currents of the transistors in the current mirror circuit, the BUS_DATA signal is non-linearly discharged as the BUS_DATA discharge current (e.g., $I_{OUT}$) is increased during activity period D. The voltage of BUS_DATA reaches a minimum voltage (e.g., approximately GND or circuit common) as the BUS_DATA discharge current $I_{OUT}$ reaches, and is maintained at, a maximum current (as indicated by activity period E). Thus, during activity periods C and D, a variable discharging rate of the BUS_DATA signal is provided.

Note that in activity periods B, C, D and E, $V_{GS}$ clamp circuit 502 acts as a current limit, limiting the voltage on Node 1 based on current $I_{LIM}$. After block 1012, processing continues to block 1014.

At block 1014, if controller 304 has additional data to transmit, then processing returns to block 1004 to transmit one or more subsequent bits on communication bus 106. If, at block 1014, controller 304 does not have additional data to transmit, then processing continues to block 1012, where transmit mode 912 is completed.

Thus, described embodiments provide improved timing of the rising and falling edges of the output signal, BUS_DATA, thus requiring little, if any, trimming. With a constant or linearly ramped current, the error due to the accuracy of the absolute current adds to total error, which is reduced and, ideally, eliminated by the variable current generated in described embodiments. Thus, over process and voltage variations, the rise and fall times of the BUS_DATA voltage can be more precisely controlled than if a linear current controls the voltage of BUS_DATA. As described herein, described embodiments set output current $I_{OUT}$ initially at a low value and ramp $I_{OUT}$ slowly to the exponential part of the waveform over time. This gives more of a rounding effect to the down-going edge of the BUS_DATA voltage waveform, reducing EMI.

For the high-to-low transition, the $I_{OUT}$ current starts at a precharge current level, $I_{START}$, reducing timing delays due to starting in the non-linear part of the current curve. This pre-charging eliminates any need for feedback on the BUS_DATA node. Eliminating feedback and, thus, an additional signal connection to the BUS_DATA signal, might also reduce EMI, by reducing the potential to generate EMI onto the BUS_DATA signal, and also by reducing the likelihood of EMI present on the BUS_DATA signal from being coupled into LIN device 300.

Thus, since the $I_{OUT}$ current can be changed non-linearly, any variances in load parasitic components (e.g., load resistance, inductance or capacitance) has reduced effect in terms of rise and fall times of the BUS_DATA signal when compared to a constant or linearly ramped current. Thus, less EMI is generated while also maintaining rise and fall times across different load conditions.

Thus, described embodiments employ open-loop control (e.g., the BUS_DATA signal is not fed back internally to controller 304). For low-to-high transitions of the BUS_DATA signal, Node 1 is pre-charged to a matched $V_{GS}$ fed with $V_{SUP}/R$. For high-to-low transitions of the BUS_DATA signal, Node 1 is clamped to a matched $V_{GS}$ fed with a small current (e.g., $I_{START}$) so that internal nodes can bias quickly, but not so large that the output experiences a "jump" or "glitch".

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component might be, but is not limited to being, a process running on a processor, a processor, an object, an executable, a thread of execution, a program, and/or a computer. By way of illustration, both an application running on a controller and the controller can be a component. One or more components might reside within a process and/or thread of execution and a component might be localized on one computer and/or distributed between two or more computers.

While the exemplary embodiments have been described with respect to processes of circuits, described embodiments might be implemented as a single integrated circuit, a multi-chip module, a single card, or a multi-card circuit pack. As would be apparent to one skilled in the art, various functions of circuit elements might also be implemented as processing blocks in a software program. Such software might be employed in, for example, a digital signal processor, micro-controller, or general purpose computer.

Some embodiments might be implemented in the form of methods and apparatuses for practicing those methods. Described embodiments might also be implemented in the form of program code embodied in tangible media, such as magnetic recording media, hard drives, floppy diskettes, magnetic tape media, optical recording media, compact discs (CDs), digital versatile discs (DVDs), solid state memory, hybrid magnetic and solid state memory, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a processing device, the program code segments combine with the processor to provide a unique device that operates analogously to specific logic circuits. Such processing devices might include, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a micro-controller, an embedded controller, a multi-core processor, and/or others, including combinations of the above. Described embodiments might also be implemented in the form of a bitstream or other sequence of signal values electrically or optically transmitted through a medium, stored magnetic-field variations in a magnetic recording medium, etc., generated using a method and/or an apparatus as recited in the claims.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

For purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage might be substituted for ground. Therefore, all gates might be powered by at least two power sources, with the attendant digital signals therefrom having voltages that range between the approximate voltages of the power sources.

Transistors are typically shown as single devices for illustrative purposes. However, it is understood that transistors will have various sizes and characteristics and might be implemented as multiple transistors coupled in parallel to achieve desired electrical characteristics from the combination, such as a desired physical size (e.g., gate width and length) or operating characteristic (e.g., isolation, switching speed, threshold voltage, gain, etc.). Further, the illustrated transistors might be composite transistors.

Unless explicitly stated otherwise, each numerical value and range should be interpreted as being approximate as if the word "about", "substantially" or "approximately" preceded the value of the value or range.

It will be further understood that various changes in the details, materials, and arrangements of the parts that have been described and illustrated herein might be made by those skilled in the art without departing from the scope of the following claims.

We claim:

1. A transmitter comprising:
a controller configured to generate data for transmission by the transmitter over a serial bus coupled to the transmitter; and
a transmit driver coupled to the controller, the transmit driver configured to, in response to the generated data for transmission:
generate low-to-high logic transitions on the serial bus by charging the serial bus by a bus current based on (i) a predetermined initial bias level for a first time period, and (ii) a first predetermined maximum bias level for a second time period; and
generate high-to-low logic transitions on the serial bus by discharging the serial bus by a bus current based on (i) a pre-charged level of the transmit driver, and (ii) a second predetermined maximum bias level for a third time period;
wherein the transmit driver comprises:
an output transistor having an output node coupled to the serial bus, the output transistor configured to:
generate low-to-high logic transitions on the serial bus wherein the controller is configured to (i) set a bias level of the output transistor to the predetermined initial bias level by a first bias current, and (ii) linearly change the bias level from the predetermined initial bias level to a second bias level by a predetermined second bias current, whereby the output transistor is configured to non-linearly charge the output node;
generate high-to-low logic transitions on the serial bus wherein the controller is configured to (i) pre-charge the bias level of the output transistor to a pre-charge bias level by a pre-charge bias current, and (ii)

linearly change the bias level from the pre-charge bias level to a fourth bias level, whereby the output transistor is configured to non-linearly discharge the output node.

2. The transmitter of claim 1, wherein the output transistor comprises a metal-oxide semiconductor field effect transistor (MOSFET).

3. The transmitter of claim 2, wherein:
the output transistor comprises an N-channel MOSFET;
wherein the N-channel MOSFET is configured to generate low-to-high logic transitions on the serial bus when the controller is configured to (i) set the bias level of a gate of the output transistor to the predetermined initial bias level, and (ii) linearly discharge the gate from the predetermined initial bias level to the second bias level, wherein the second bias level is a minimum bias threshold of the MOSFET;
wherein the N-channel MOSFET is configured to generate high-to-low logic transitions on the serial bus when the controller is configured to (i) pre-charge the gate of the output transistor to the pre-charge bias level by a pre-charge bias current, and (ii) linearly charge the gate from the pre-charge bias level to the fourth bias level, wherein the fourth bias level is a maximum bias threshold of the MOSFET; and
wherein the output node is non-linearly charged and discharged by changing a drain-to-source current through the MOSFET according to a squared value of the bias level.

4. The transmitter of claim 2, wherein:
the output transistor comprises a P-channel MOSFET;
wherein the P-channel MOSFET is configured to generate low-to-high logic transitions on the serial bus when the controller is configured to (i) pre-charge a gate of the output transistor to a pre-charge bias level by a pre-charge bias current, and (ii) linearly charge the gate from the pre-charge bias level to a maximum bias threshold of the MOSFET;
wherein the P-channel MOSFET is configured to generate high-to-low logic transitions on the serial bus when the controller is configured to (i) set the gate of the output transistor to a predetermined initial bias level, and (ii) linearly discharge the gate from the predetermined initial bias level to a minimum bias threshold of the MOSFET; and
wherein the output node is non-linearly charged and discharged by changing a drain-to-source current through the MOSFET according to a squared value of the bias level.

5. The transmitter of claim 1, wherein the output transistor comprises a bipolar junction transistor (BJT).

6. The transmitter of claim 5, wherein:
the output transistor comprises an NPN doped BJT;
wherein the NPN BJT is configured to generate low-to-high logic transitions on the serial bus when the controller is configured to (i) set a bias level of a base of the output transistor to a predetermined initial bias level, and (ii) linearly discharge the base from the predetermined initial bias level to the second bias level, wherein the second bias level is a minimum bias threshold of the BJT;
the NPN BJT configured to generate high-to-low logic transitions on the serial bus when the controller is configured to (i) pre-charge the base to the pre-charge bias level, and (ii) linearly charge the base from the pre-charge bias level to the fourth bias level, wherein the fourth bias level is a maximum bias threshold of the BJT; and
wherein the output node is non-linearly charged and discharged by changing a collector-to-emitter current through the NPN BJT proportionally to an exponential of the bias level.

7. The transmitter of claim 5, wherein:
the output transistor comprises a PNP doped BJT;
wherein the PNP BJT is configured to generate low-to-high logic transitions on the serial bus when the controller is configured to (i) pre-charge a base of the output transistor to a pre-charge bias level by a pre-charge bias current, and (ii) linearly charge the base from the pre-charge bias level to a maximum bias threshold of the BJT;
wherein the PNP BJT is configured to generate high-to-low logic transitions on the serial bus when the controller is configured to (i) set the base of the output transistor to a predetermined initial bias level, and (ii) linearly discharge the base from the predetermined initial bias level to a minimum bias threshold of the BJT; and
wherein the output node is non-linearly charged and discharged by changing a collector-to-emitter current through the PNP BJT proportionally to an exponential of the bias level.

8. The transmitter of claim 1, wherein the controller is configured to linearly change the bias level from the predetermined initial bias level to the second bias level in a first predetermined time duration.

9. The transmitter of claim 1, wherein the controller is configured to linearly change the bias level from the pre-charge bias level to the fourth bias level in a second predetermined time duration.

10. The transmitter of claim 1, wherein the controller is configured to calibrate the transmitter.

11. The transmitter of claim 10, wherein, for the calibration, the controller is configured to:
estimate one or more parasitic components of the serial bus; and
set at least one of the predetermined initial bias level, the second bias level, the pre-charge bias level, the maximum bias level, the minimum bias level, the first predetermined time duration, and the second predetermined time duration based, at least in part, on the estimated one or more parasitic components of the serial bus.

12. The transmitter of claim 1, wherein the transmit driver further comprises:
an amplifier configured to (i) buffer a control signal from the processor to the output transistor and (ii) generate an amplified bias signal, based on the control signal, to the output transistor.

13. The transmitter of claim 12, wherein the transmit driver further comprises:
at least one current mirror circuit configured to drive the output transistor based on at least one of the control signal and the amplified bias signal.

14. The transmitter of claim 1, wherein the transmitter is configured to operate open loop.

15. The transmitter of claim 1, wherein the serial bus is a Local Interconnect Network (LIN) bus.

16. A system comprising:
a plurality of devices coupled to a serial bus, each of the plurality of devices comprising:
   a controller configured to generate data for transmission by a transmitter of the device over the serial bus; and
   a transmit driver coupled to the controller, the transmit driver configured to, in response to the generated data for transmission:
      generate low-to-high logic transitions on the serial bus by charging the serial bus by a bus current based on (i) a predetermined initial bias level for a first time period, and (ii) a first predetermined maximum bias level for a second time period; and
      generate high-to-low logic transitions on the serial bus by discharging the serial bus by a bus current based on (i) a pre-charged level of the transmit driver, and (ii) a second predetermined maximum bias level for a third time period;
   wherein the transmit driver comprises:
   an output transistor having an output node coupled to the serial bus, the output transistor configured to:
      generate low-to-high logic transitions on the serial bus wherein the controller is configured to (i) set a bias level of the output transistor to a predetermined initial bias level by a first bias current, and (ii) linearly change the bias level from the predetermined initial bias level to a second bias level by a predetermined second bias current, whereby the output transistor is configured to non-linearly charge the output node; and
      generate high-to-low logic transitions on the serial bus wherein the controller is configured to (i) pre-charge the bias level of the output transistor to a pre-charge bias level by a pre-charge bias current, and (ii) linearly change the bias level from the pre-charge bias level to a fourth bias level, whereby the output transistor is configured to non-linearly discharge the output node.

17. The system of claim 16, wherein the output transistor comprises one of: a metal-oxide semiconductor field effect transistor (MOSFET) and a bipolar junction transistor (BJT).

18. The system of claim 16,
wherein the plurality of devices comprise at least one of: a motor control, a magnetic field sensor, a gear shift sensor, a speed sensor, a current sensor, a temperature sensor, an automotive lighting control, an automotive seat position control, a transmission sensor, a wheel speed sensor, a crankshaft sensor, and a camshaft sensor.

19. The system of claim 16, wherein the controller is configured to
   estimate one or more parasitic components of the serial bus; and
   set at least one of the predetermined initial bias level, the second bias level, the pre-charge bias level, the maximum bias level, the minimum bias level, the first predetermined time duration, and the second predetermined time duration based, at least in part, on the estimated one or more parasitic components of the serial bus.

20. The system of claim 16, wherein the transmit driver further comprises:
   an amplifier configured to (i) buffer a control signal from the processor to the output transistor and (ii) generate an amplified bias signal, based on the control signal, to the output transistor.

21. The system of claim 16, wherein the transmit driver further comprises:
   at least one current mirror circuit configured to drive the output transistor based on at least one of the control signal and the amplified bias signal.

22. The system of claim 16, wherein the transmitter is configured to operate open loop.

23. The system of claim 16, wherein the serial bus is a Local Interconnect Network (LIN) bus.

24. A method of operating a transmitter coupled to a serial bus, the method comprising:
   determining, by a controller of the transmitter, whether one or more data bits are to be transmitted over the serial bus and, if so, for each data bit to be transmitted:
      generating, by a transmit driver of the transmitter, a low-to-high logic transition on the serial bus by charging the serial bus by a bus current based on (i) a predetermined initial bias level for a first time period, and (ii) a first predetermined maximum bias level for a second time period; and
      generating, by the transmit driver, a high-to-low logic transition on the serial bus by discharging the serial bus by a bus current based on (i) a pre-charged level of the transmit driver, and (ii) a second predetermined maximum bias level for a third time period;
   wherein the transmit driver comprises an output transistor having an output node coupled to the serial bus, the method further comprising:
      generating low-to-high logic transitions on the serial bus by (i) setting a bias level of the output transistor to a predetermined initial bias level by a first bias current, and (ii) linearly changing the bias level from the predetermined initial bias level to a second bias level by a predetermined second bias current, whereby the output transistor non-linearly charges the output node; and
      generating high-to-low logic transitions on the serial bus by (i) pre-charging the bias level of the output transistor to a pre-charge bias level by a pre-charge bias current, and (ii) linearly changing the bias level from the pre-charge bias level to a fourth bias level, whereby the output transistor non-linearly discharges the output node.

25. The method of claim 24, wherein the output transistor comprises one of: a metal-oxide semiconductor field effect transistor (MOSFET) and a bipolar junction transistor (BJT).

26. The method of claim 24, further comprising:
   estimating, by the controller, one or more parasitic components of the serial bus; and
   setting, by the controller, at least one of the predetermined initial bias level, the second bias level, the pre-charge bias level, the maximum bias level, the minimum bias level, the first predetermined time duration, and the second predetermined time duration based, at least in part, on the estimated one or more parasitic components of the serial bus.

27. The method of claim 24, wherein the transmit driver further comprises an amplifier, the method further comprising:
   buffering, by the amplifier, a control signal from the processor to the output transistor; and generating, by the amplifier, an amplified bias signal, based on the control signal, to the output transistor.

28. The method of claim 24, wherein the transmit driver further comprises at least one current mirror circuit, the method further comprising:
driving, by the at least one current mirror circuit, the output transistor based on at least one of the control signal and the amplified bias signal.

29. The method of claim 24, further comprising:
operating the transmitter open loop.

30. The method of claim 24, wherein the serial bus is a Local Interconnect Network (LIN) bus.

* * * * *

UNITED STATES PATENT AND TRADEMARK OFFICE
CERTIFICATE OF CORRECTION

PATENT NO. : 9,928,194 B2  
APPLICATION NO. : 14/954133  
DATED : March 27, 2018  
INVENTOR(S) : Thomas Ross et al.

Page 1 of 1

It is certified that error appears in the above-identified patent and that said Letters Patent is hereby corrected as shown below:

In the Specification

Column 12, Line 25 delete "1our" and replace with --Iout--.

Signed and Sealed this  
Sixteenth Day of October, 2018

Andrei Iancu  
*Director of the United States Patent and Trademark Office*